(12) United States Patent
Shimizu

(10) Patent No.: US 11,262,619 B2
(45) Date of Patent: Mar. 1, 2022

(54) DISPLAY AND LIGHTING APPARATUS INCLUDING A LIGHT-EMITTING UNIT THAT EMITS HIGH QUALITY ILLUMINATION THROUGH ARRANGEMENTS OF LENSES AND LIGHT EMITTING DEVICES

(71) Applicant: Saturn Licensing LLC, New York, NY (US)

(72) Inventor: Takaharu Shimizu, Tokyo (JP)

(73) Assignee: Saturn Licensing LLC, New York, NY (US)

( * ) Notice: Subject to any disclaimer, the term of this patent is extended or adjusted under 35 U.S.C. 154(b) by 0 days.

(21) Appl. No.: 16/628,741

(22) PCT Filed: May 11, 2018

(86) PCT No.: PCT/JP2018/018278
§ 371 (c)(1),
(2) Date: Jan. 6, 2020

(87) PCT Pub. No.: WO2019/012793
PCT Pub. Date: Jan. 17, 2019

(65) Prior Publication Data
US 2020/0285113 A1 Sep. 10, 2020

(30) Foreign Application Priority Data
Jul. 13, 2017 (JP) .............................. JP2017-136822

(51) Int. Cl.
*G02F 1/13357* (2006.01)

(52) U.S. Cl.
CPC .. *G02F 1/133606* (2013.01); *G02F 1/133603* (2013.01); *G02F 1/133605* (2013.01); *G02F 2001/133607* (2013.01)

(58) Field of Classification Search
CPC ......... G02F 1/133606; G02F 1/133605; G02F 1/133603; G02F 2001/133607
See application file for complete search history.

(56) References Cited

U.S. PATENT DOCUMENTS

| 2001/0019486 | A1 | 9/2001 | Thominet |
| 2007/0109779 | A1 | 5/2007 | Sekiguchi et al. |
| 2012/0063150 | A1 | 3/2012 | Takeuchi |
| 2012/0218479 | A1* | 8/2012 | Nagata .............. G02F 1/133603 348/790 |

(Continued)

FOREIGN PATENT DOCUMENTS

| EP | 2733755 A1 | 5/2014 |
| JP | 2007157686 A | 6/2007 |

(Continued)

OTHER PUBLICATIONS

JP2014082336, Jul. 2014, machine translation (Year: 2014).*
International Search Report for Application No. PCT/JP2018/018278, dated Aug. 7, 2018, pp. 1-3.

*Primary Examiner* — Tracie Y Green
(74) *Attorney, Agent, or Firm* — Lerner, David, Littenberg, Krumholz & Mentlik, LLP

(57) ABSTRACT

A light-emitting unit includes a plurality of lenses; and two or more light-emitting devices covered by each of the lenses, and the two or more light-emitting devices covered by one lens of the lenses are electrically separated from each other.

19 Claims, 23 Drawing Sheets

(56) References Cited

U.S. PATENT DOCUMENTS

| | | | |
|---|---|---|---|
| 2012/0262631 A1 | 10/2012 | Kuromizu | |
| 2013/0194795 A1* | 8/2013 | Onaka | G02B 19/0066 |
| | | | 362/231 |
| 2015/0009681 A1* | 1/2015 | Takase | G02F 1/133603 |
| | | | 362/308 |
| 2016/0370652 A1* | 12/2016 | Hwang | G02F 1/133605 |
| 2017/0059120 A1 | 3/2017 | Kataoka | |
| 2017/0181241 A1* | 6/2017 | Koo | H01L 33/56 |
| 2017/0357124 A1* | 12/2017 | Tanaka | G09F 9/00 |

FOREIGN PATENT DOCUMENTS

| | | |
|---|---|---|
| JP | 201134770 A | 2/2011 |
| JP | 201482236 A | 5/2014 |
| WO | 2010134565 A1 | 11/2010 |
| WO | 2011080979 A1 | 7/2011 |
| WO | 2013060329 A1 | 5/2013 |
| WO | 2017111413 A1 | 6/2017 |

\* cited by examiner

[FIG. 1]
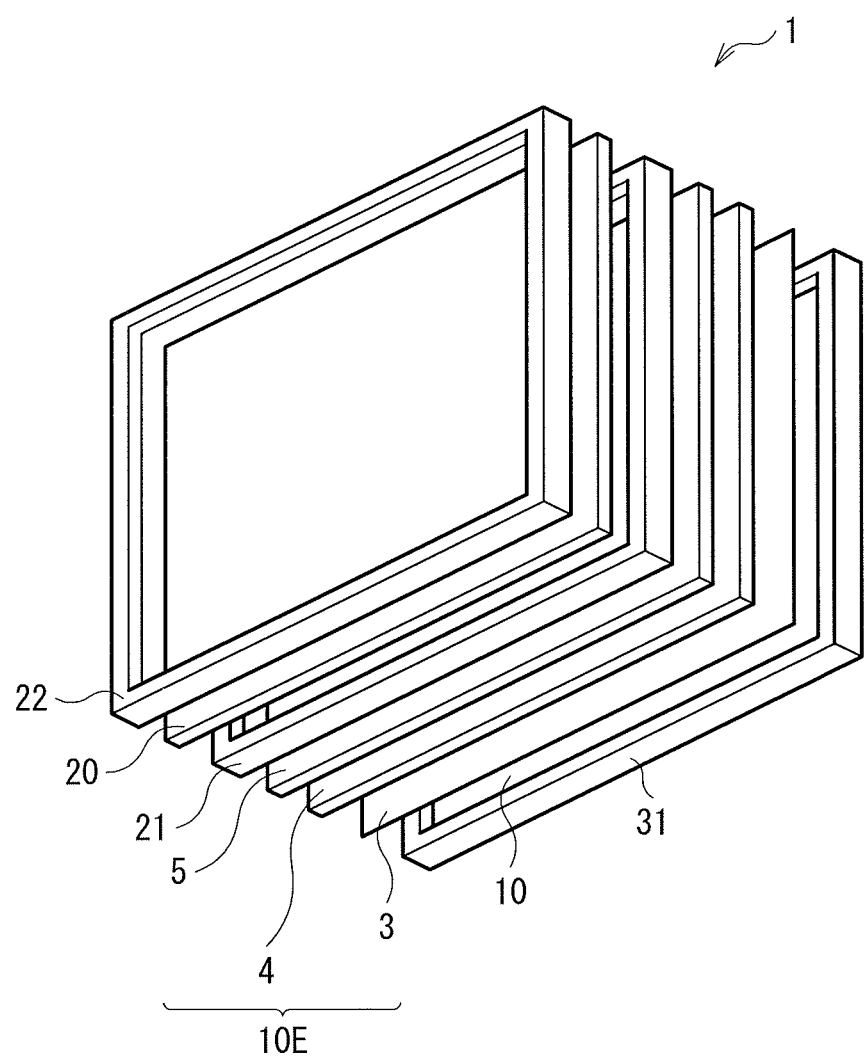

[FIG. 2]
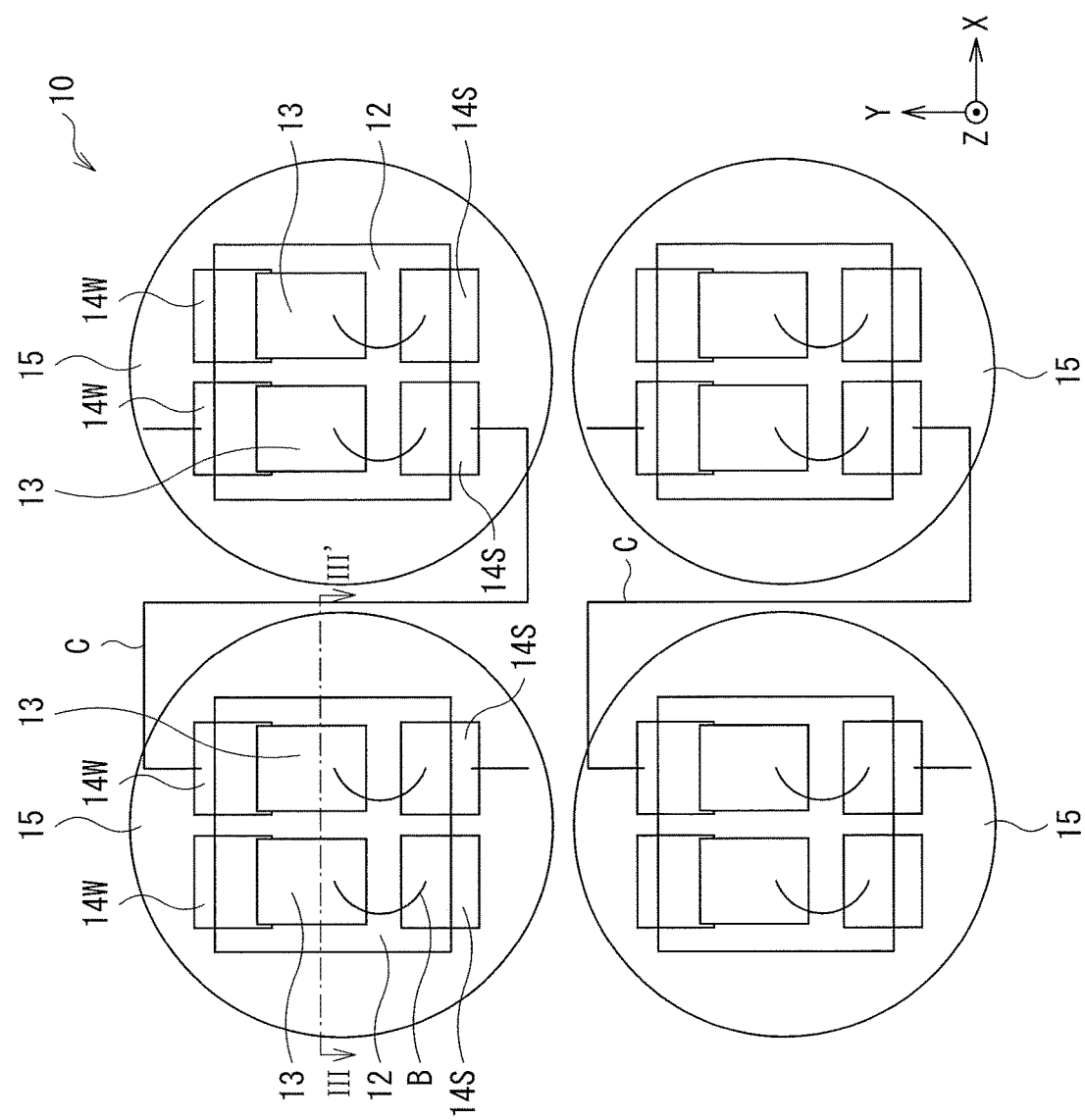

[ FIG. 3 ]
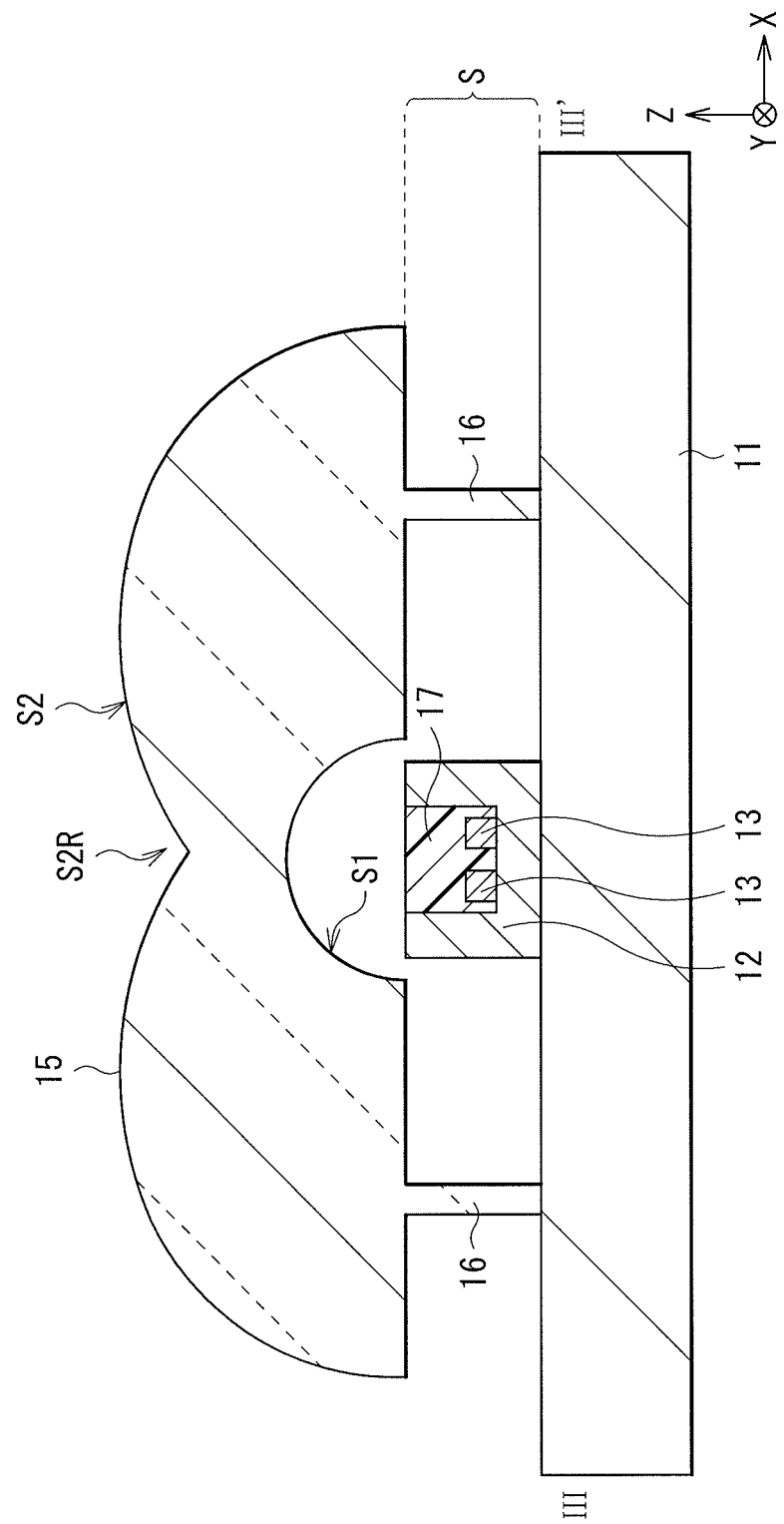

[FIG. 4]
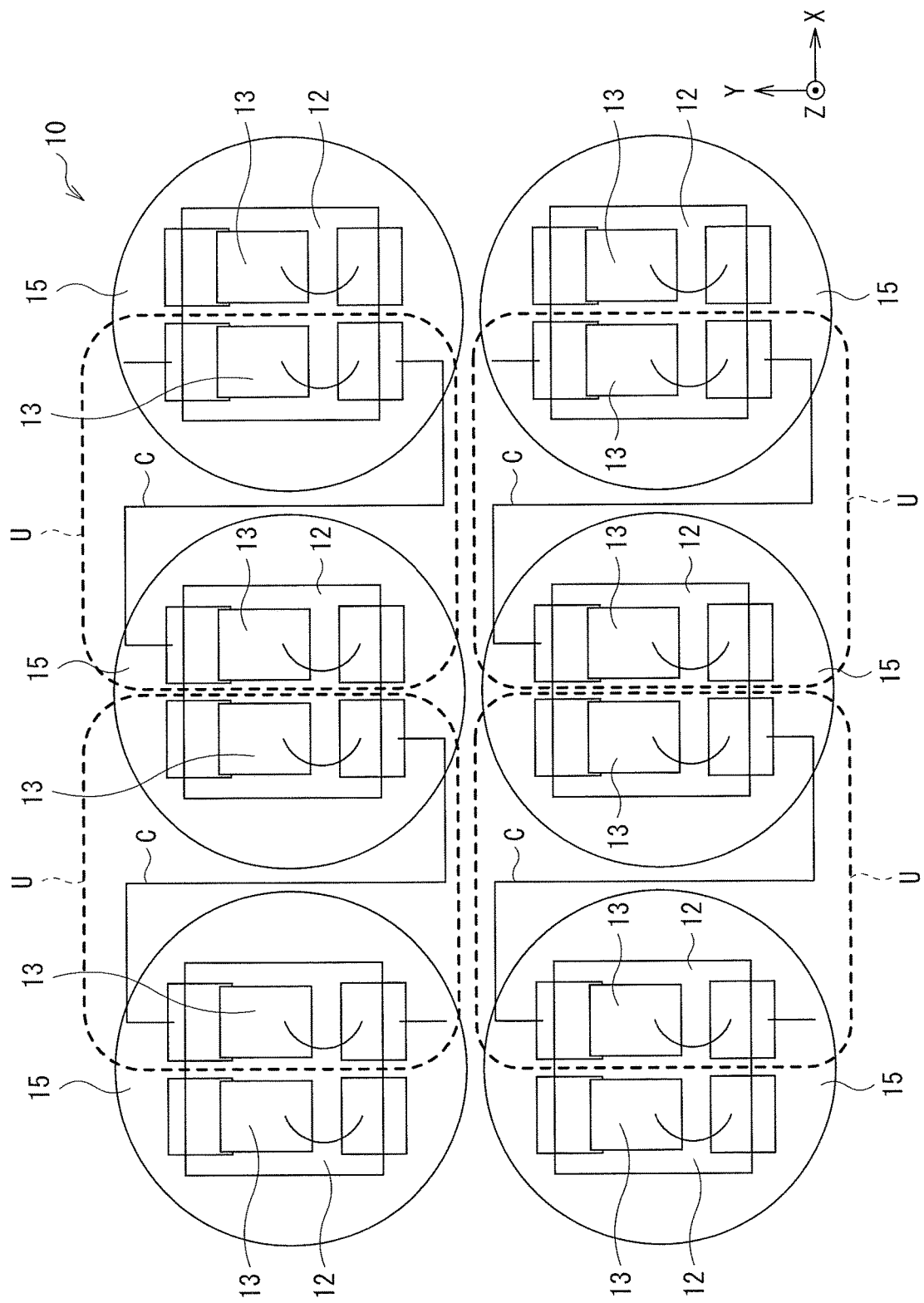

[FIG. 5]
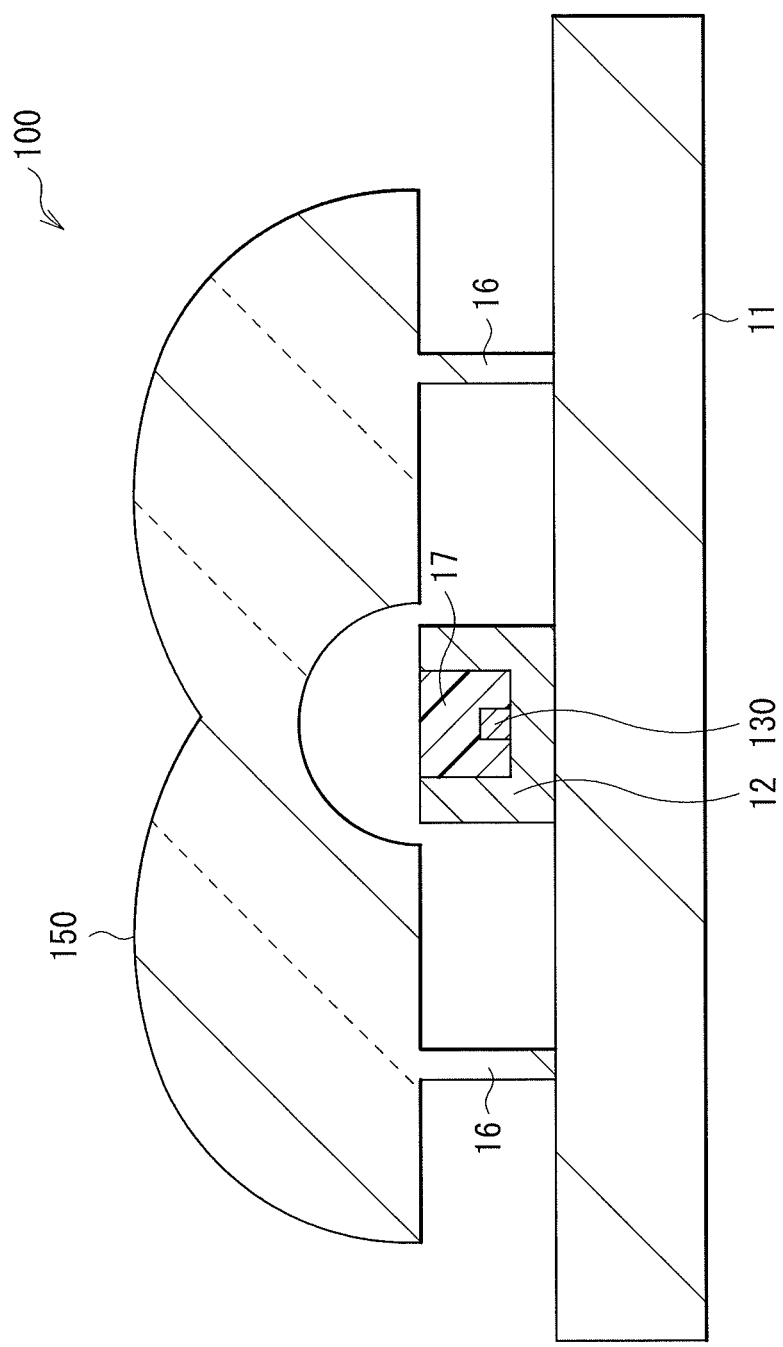

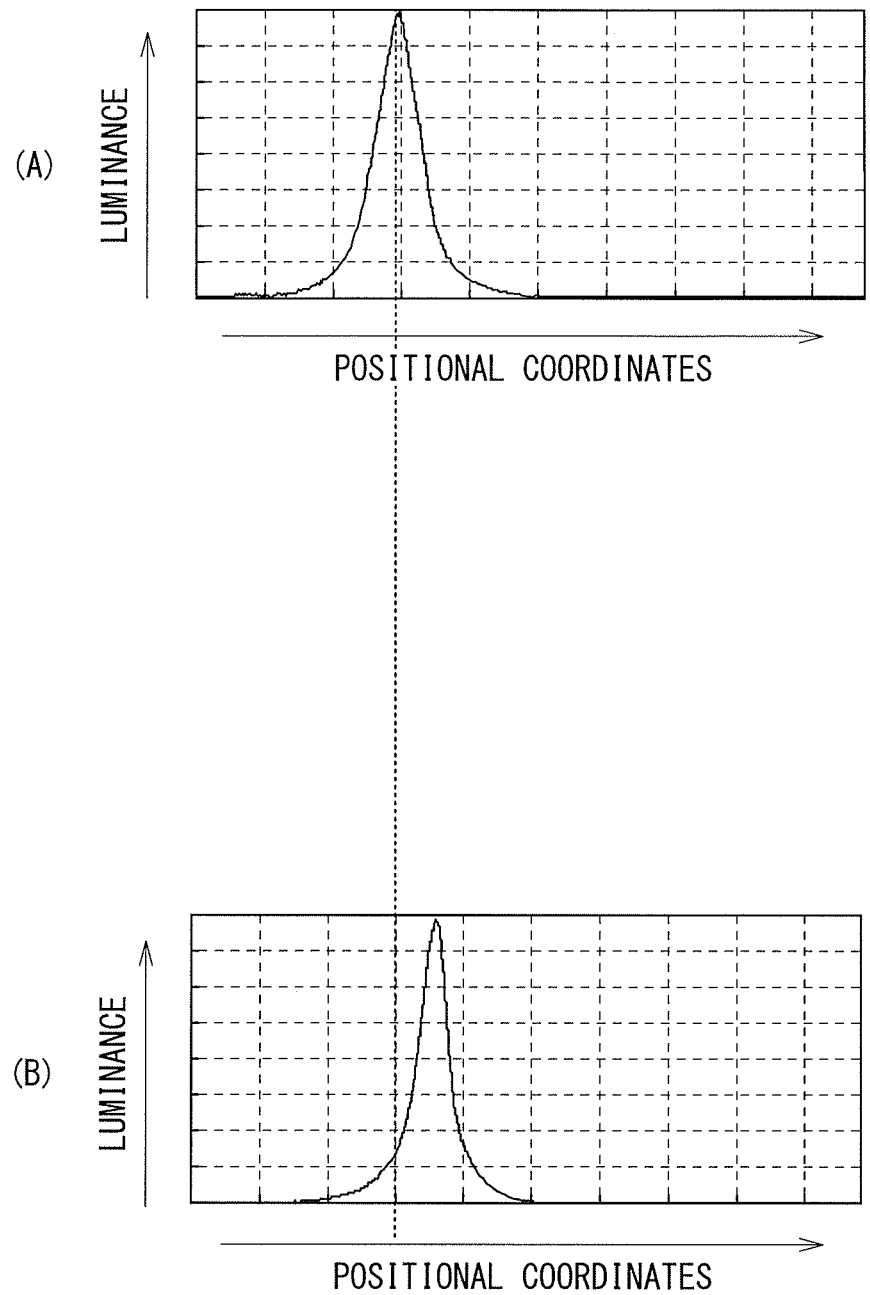

[ FIG. 7 ]
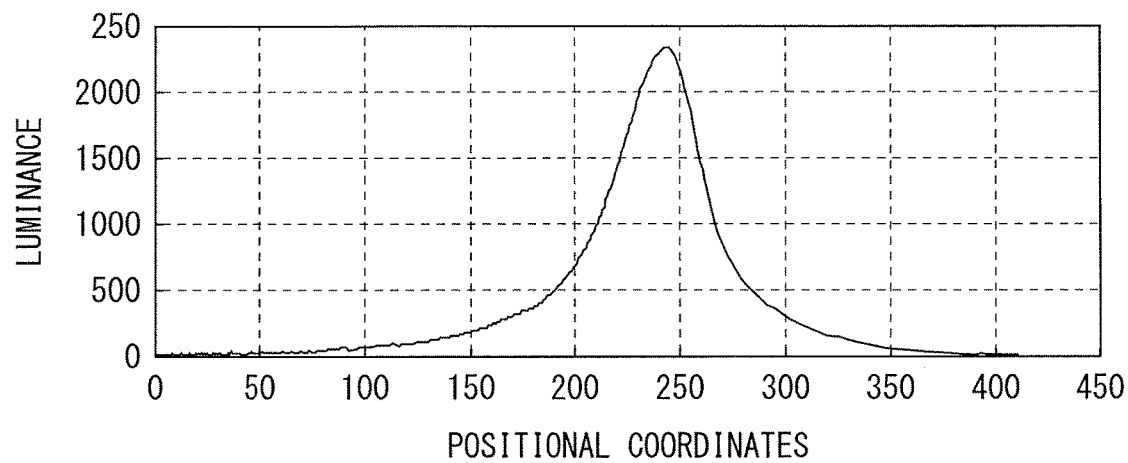
[ FIG. 8 ]
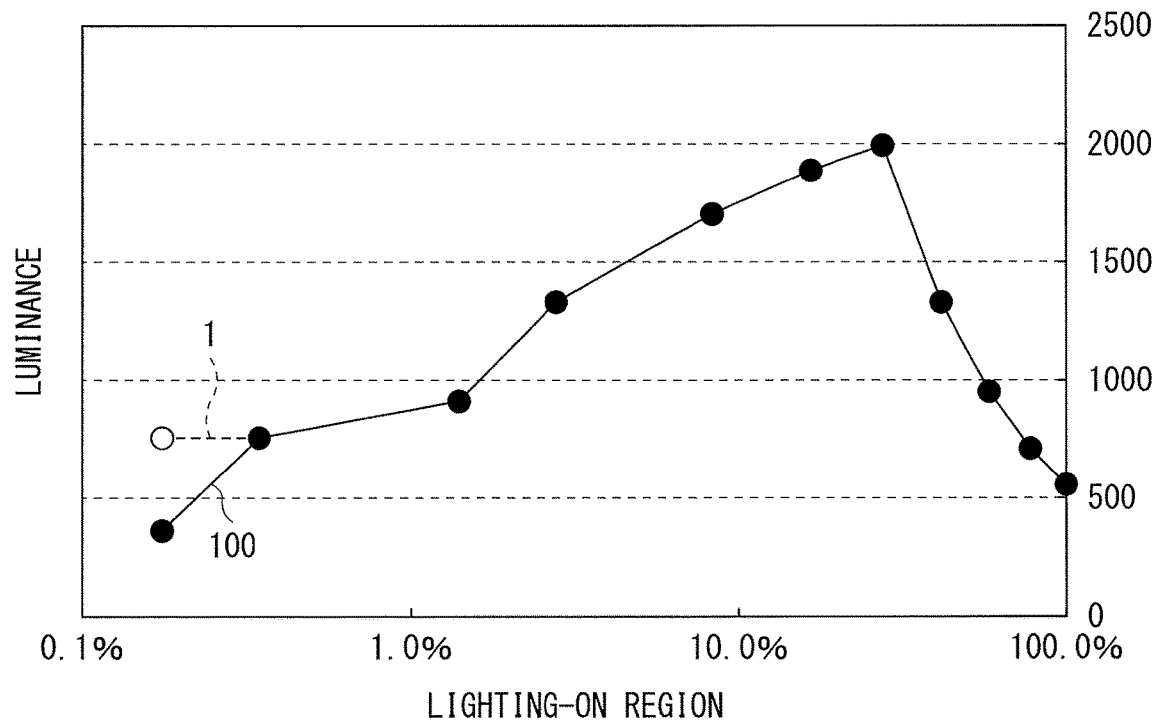

[ FIG. 9 ]
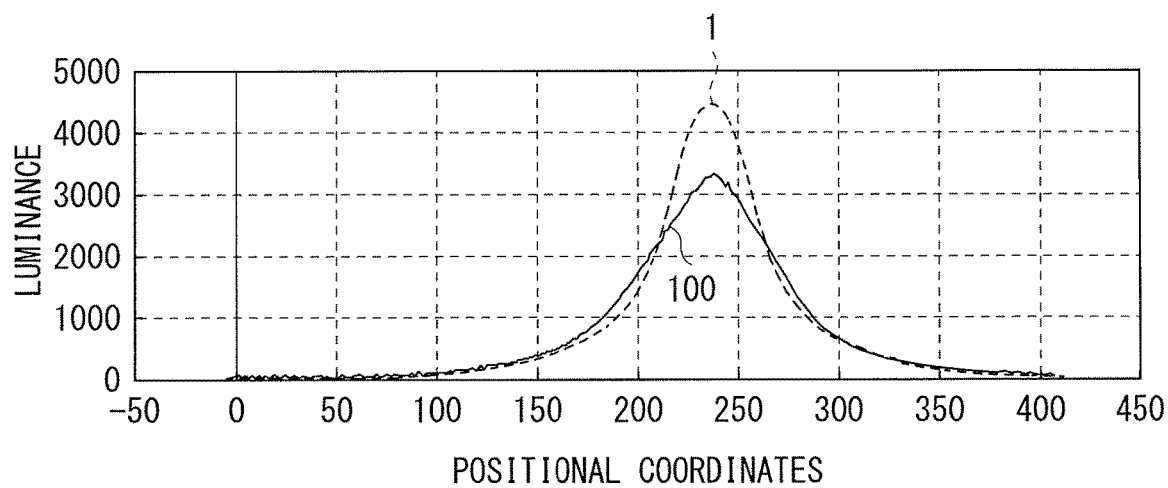
[ FIG. 10 ]
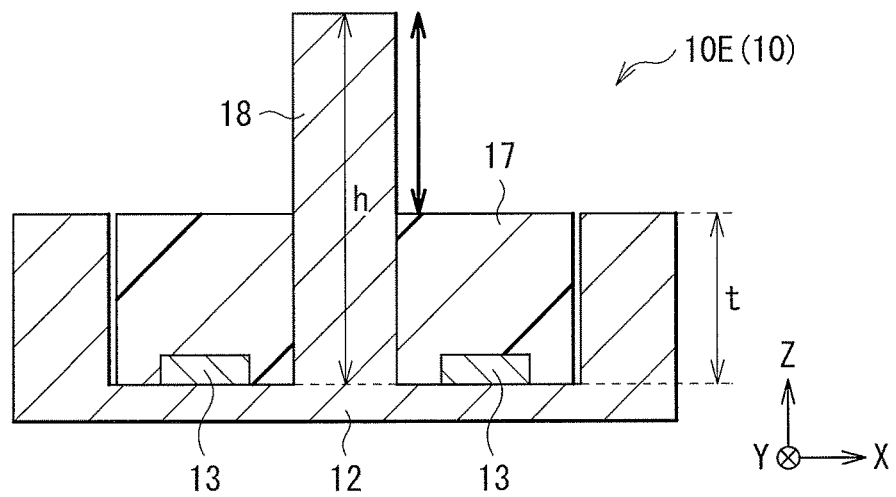

[ FIG. 11 ]
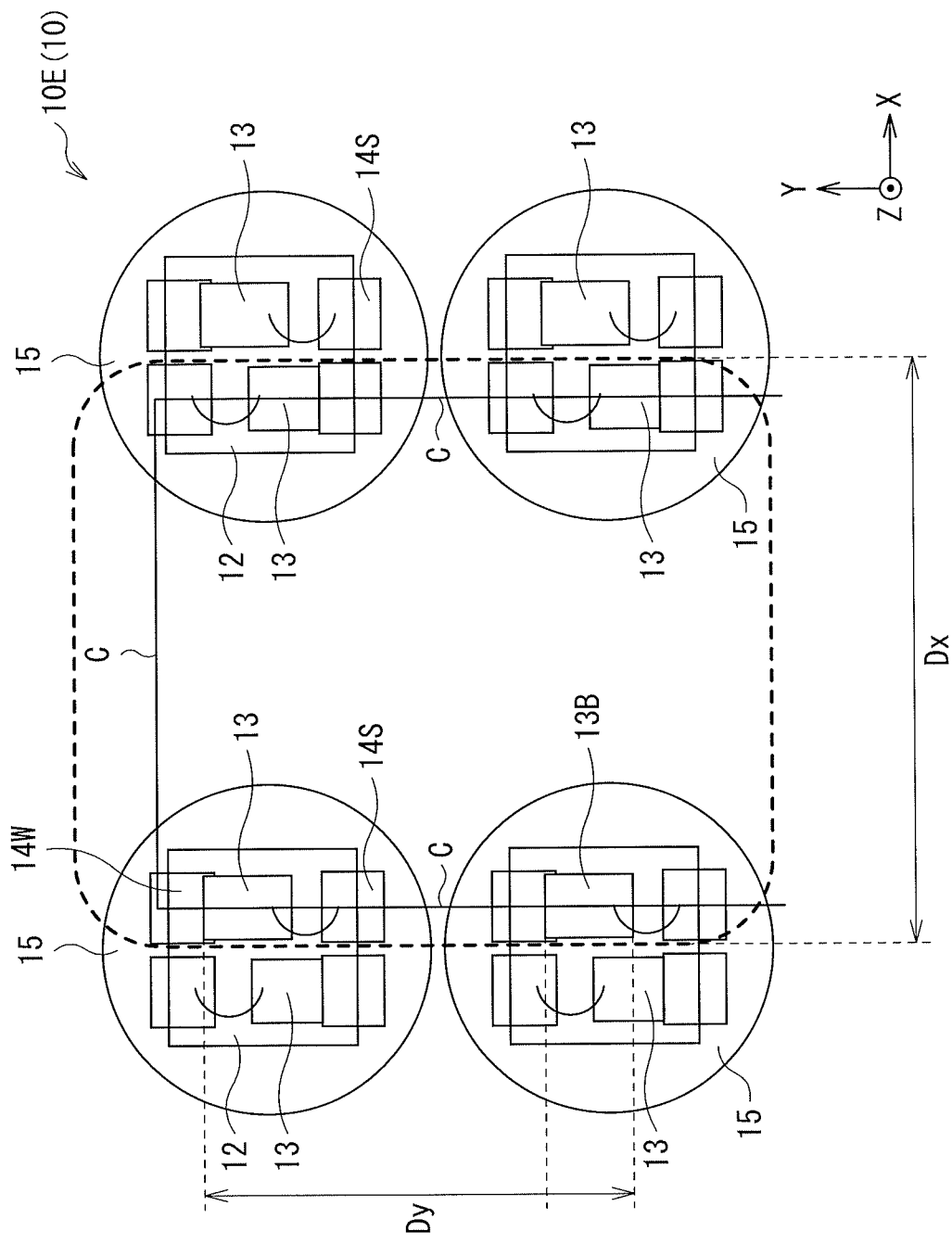

[ FIG. 12 ]
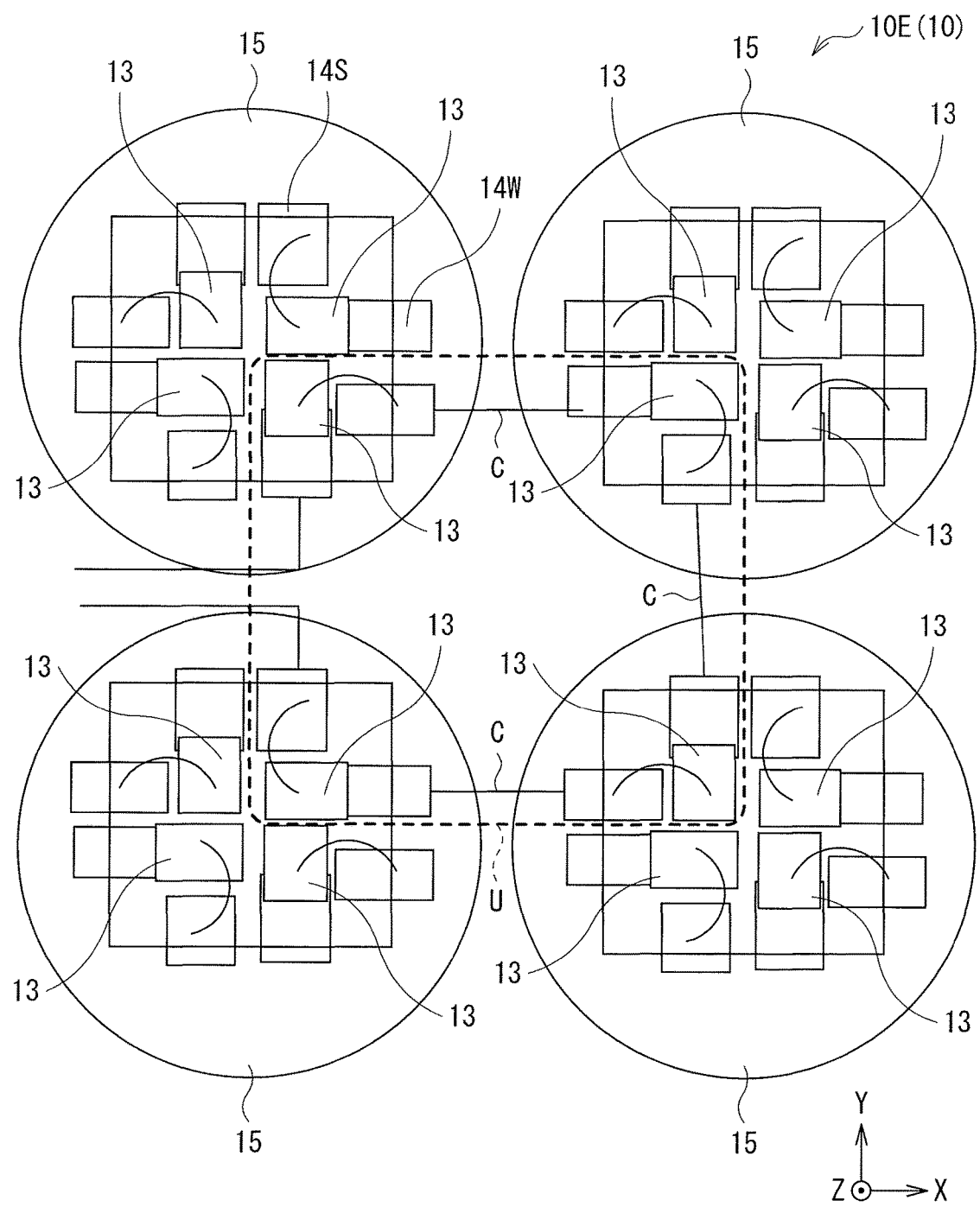

[ FIG. 13A ]
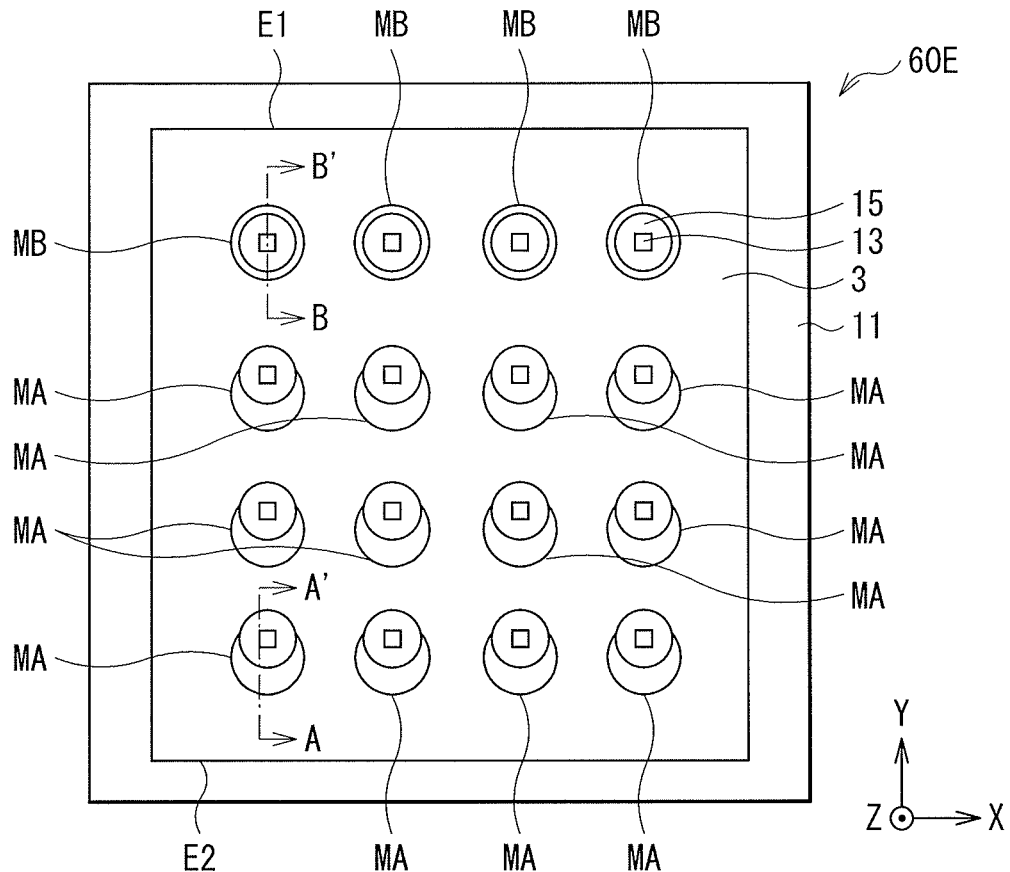
[ FIG. 13B ]
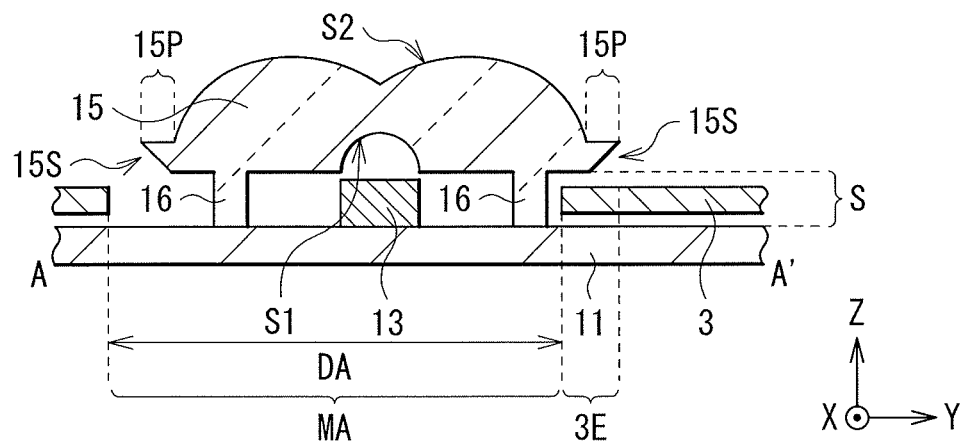

[ FIG. 13C ]
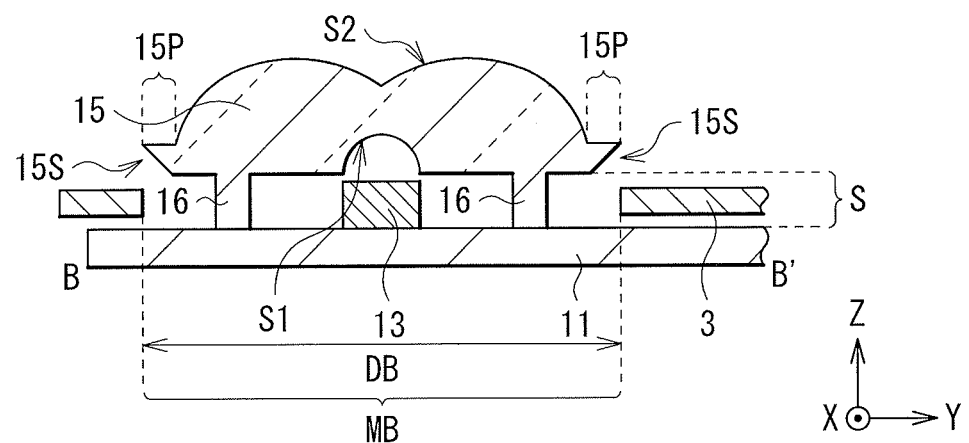
[ FIG. 14 ]
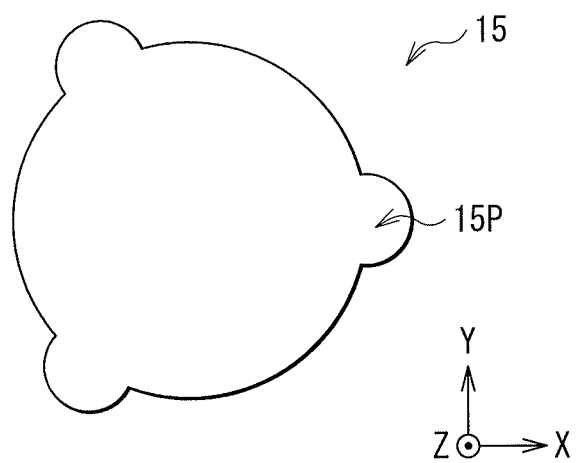

[ FIG. 15A ]
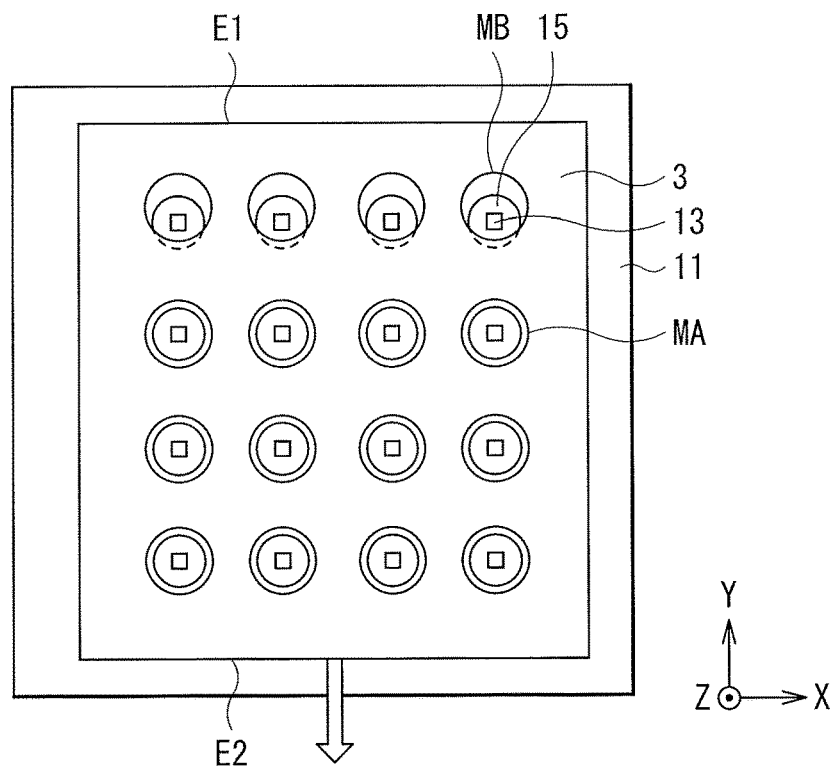
[ FIG. 15B ]
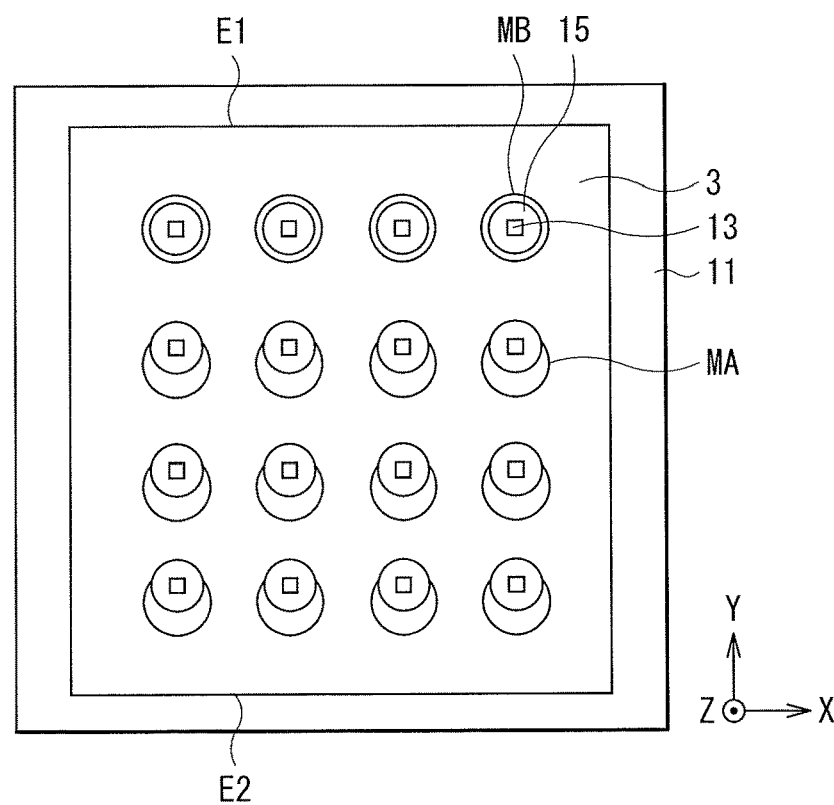

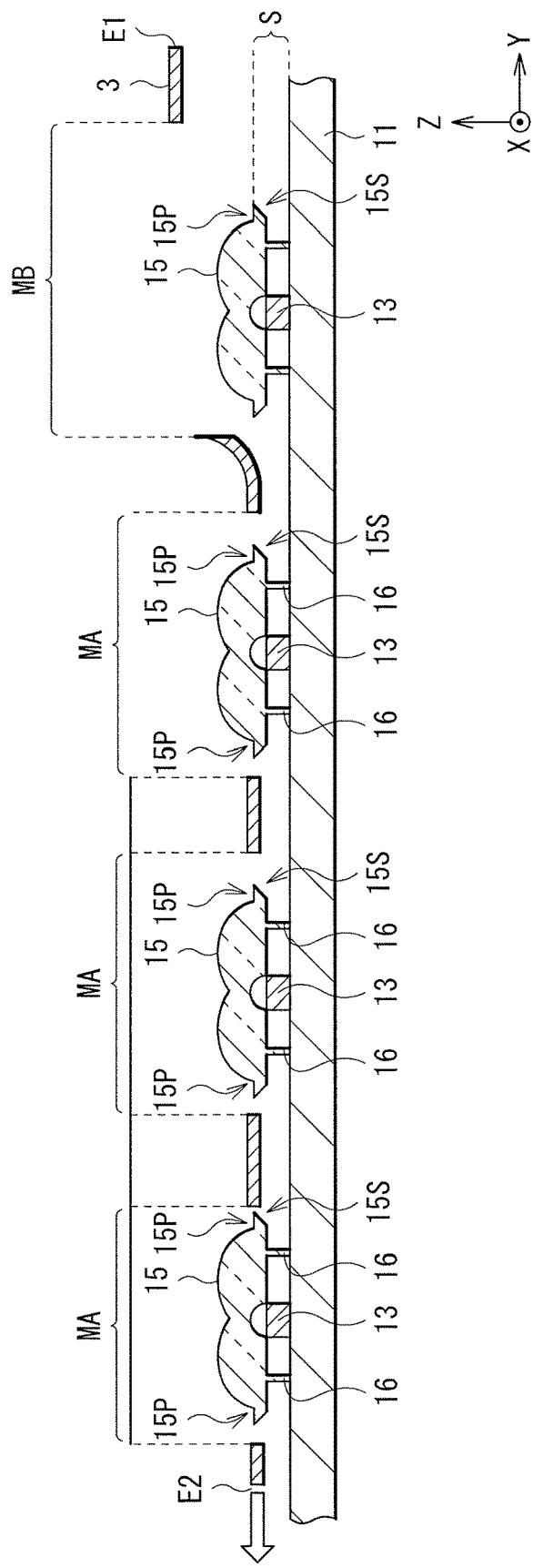
[FIG. 16A]

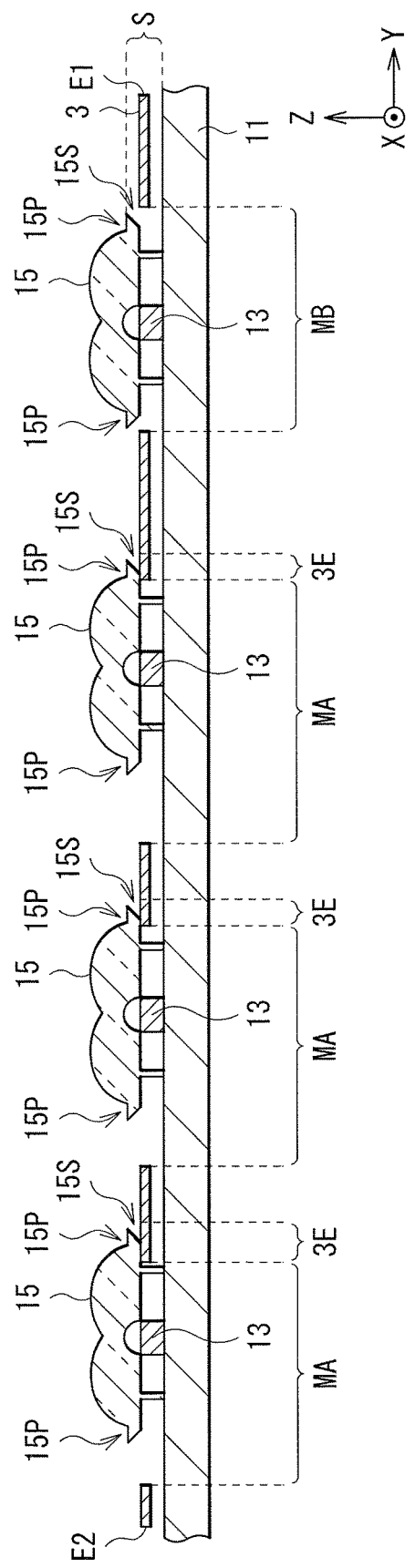
[ FIG. 16B ]

[ FIG. 17 ]
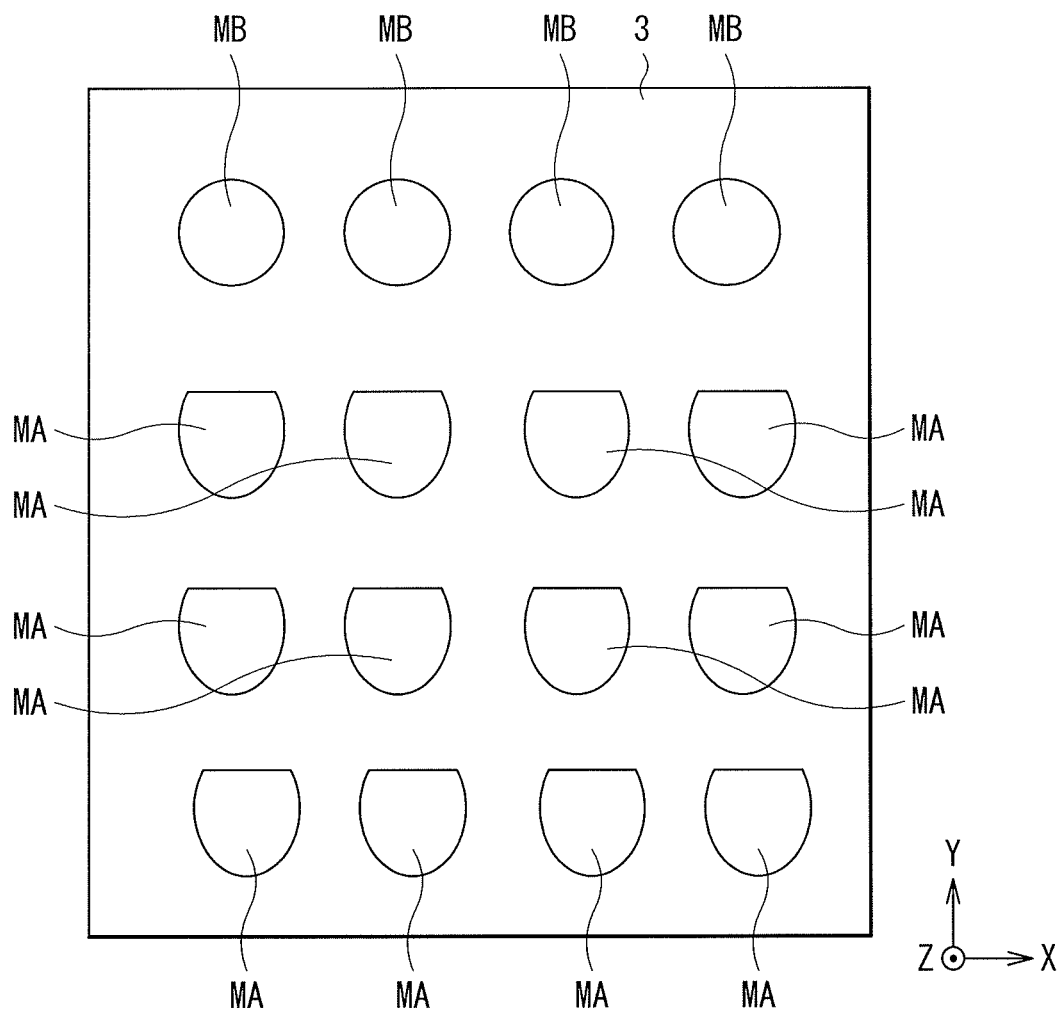

[ FIG. 18 ]
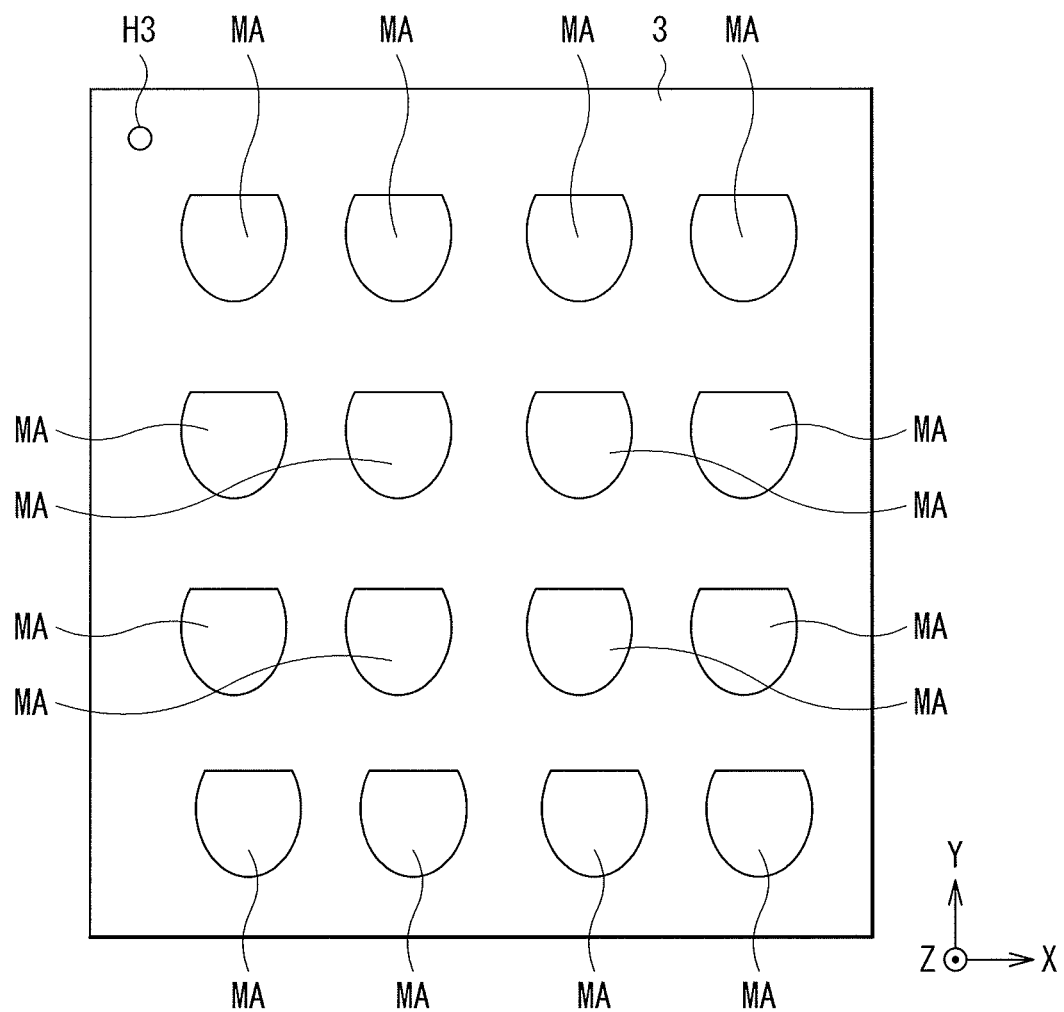

[ FIG. 19A ]
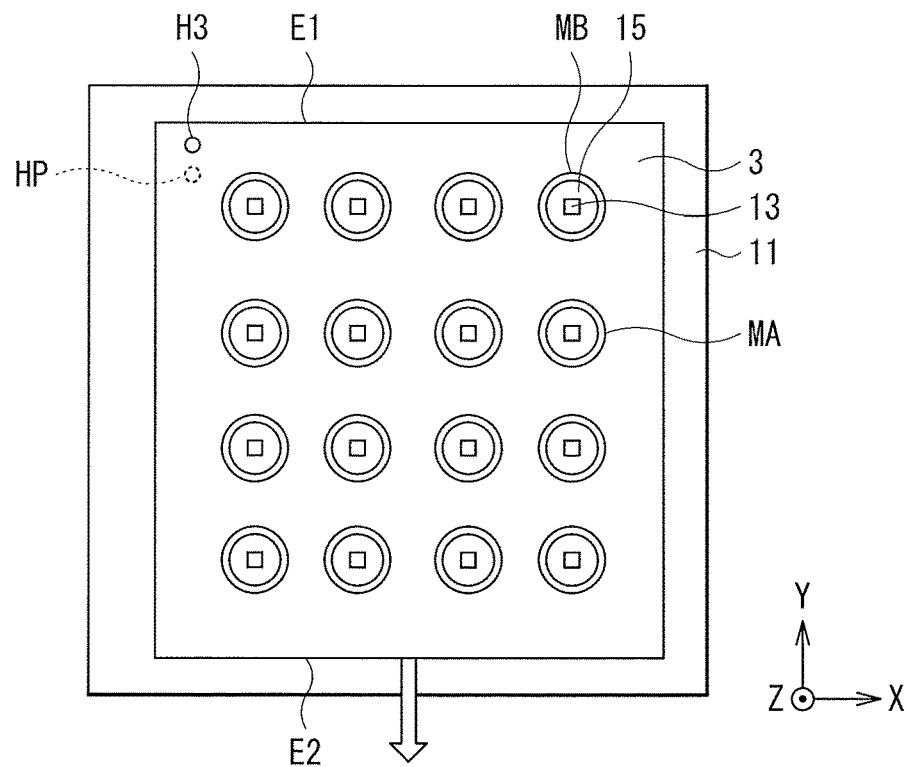
[ FIG. 19B ]
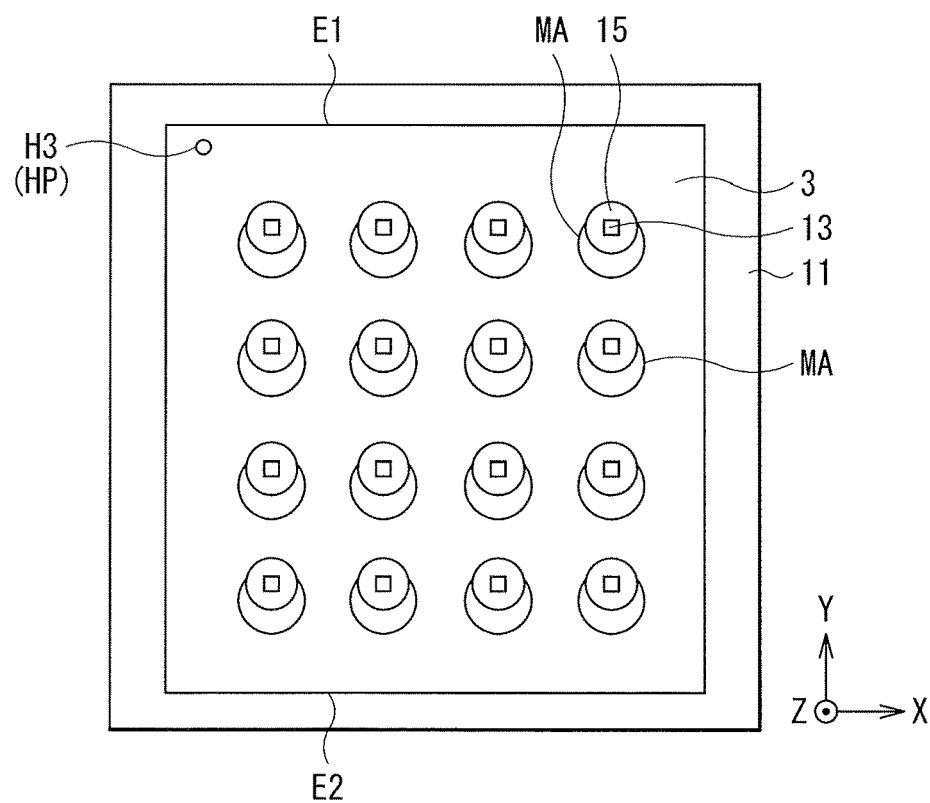

[ FIG. 20A ]
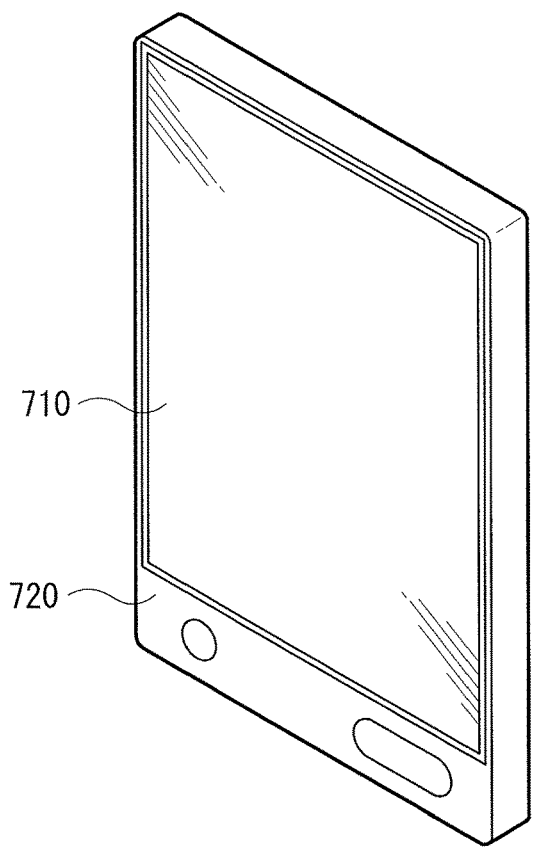
[ FIG. 20B ]
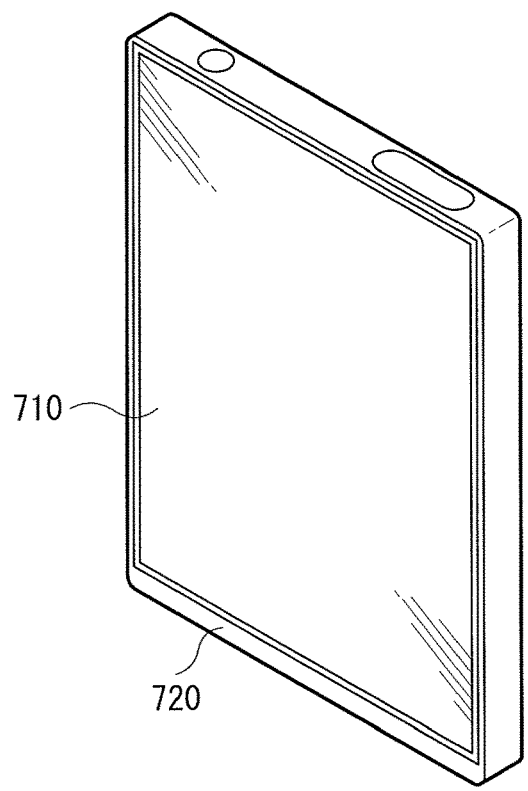

[ FIG. 21 ]
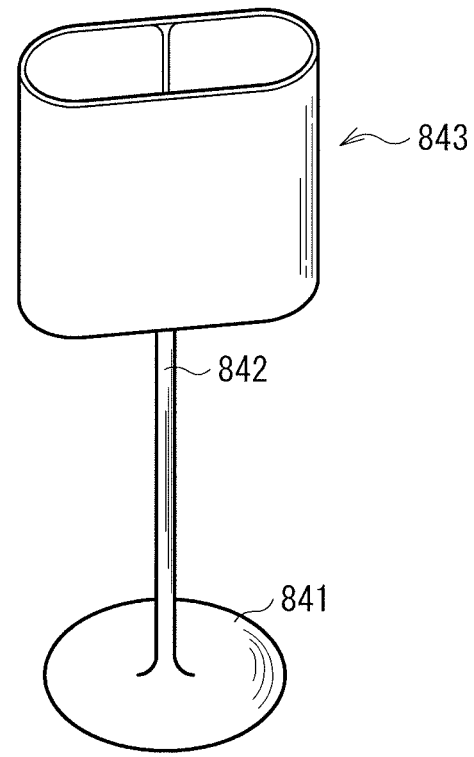
[ FIG. 22 ]
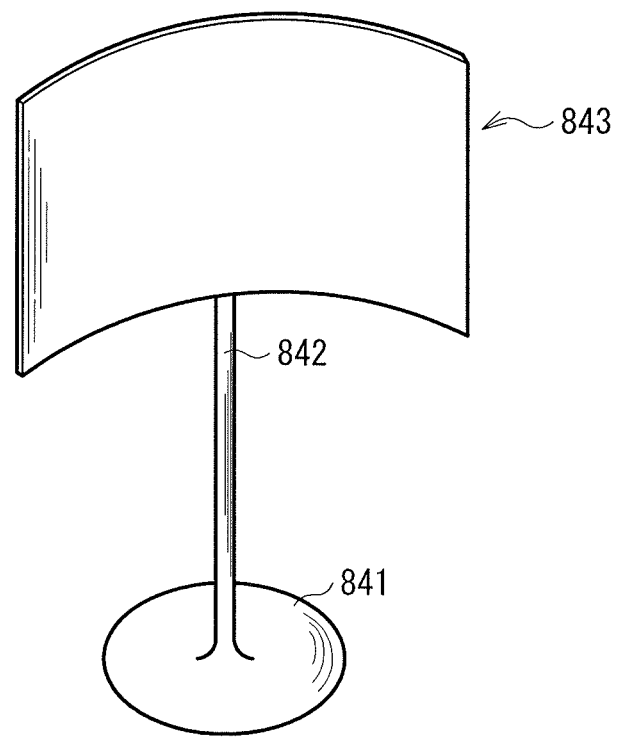

[ FIG. 23 ]
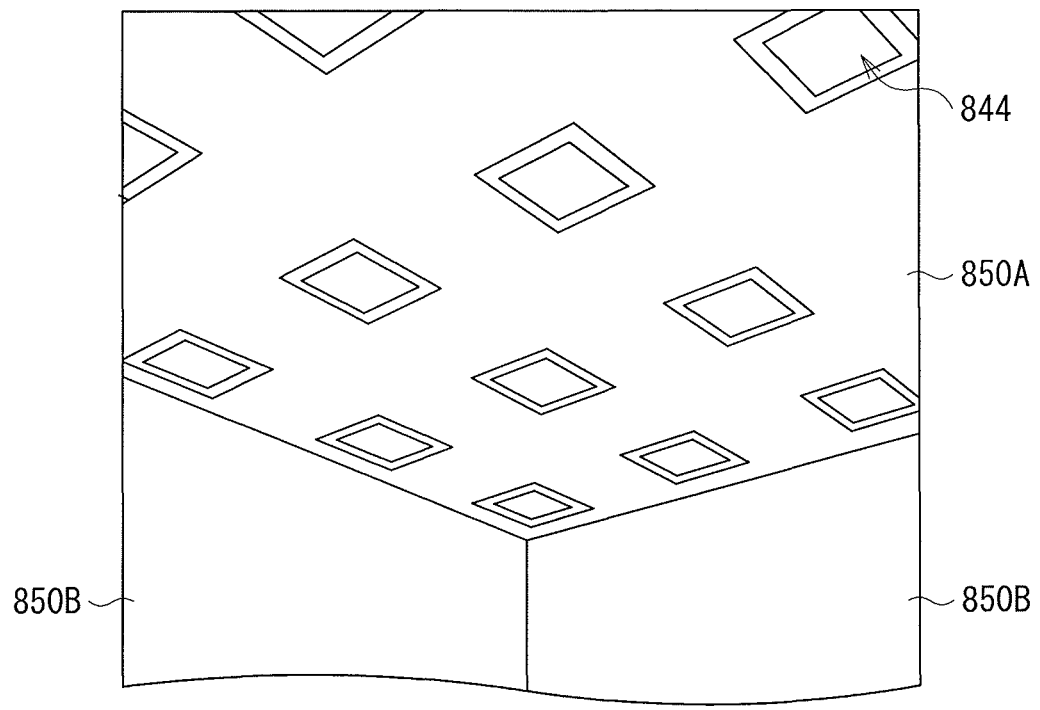

[ FIG. 24 ]
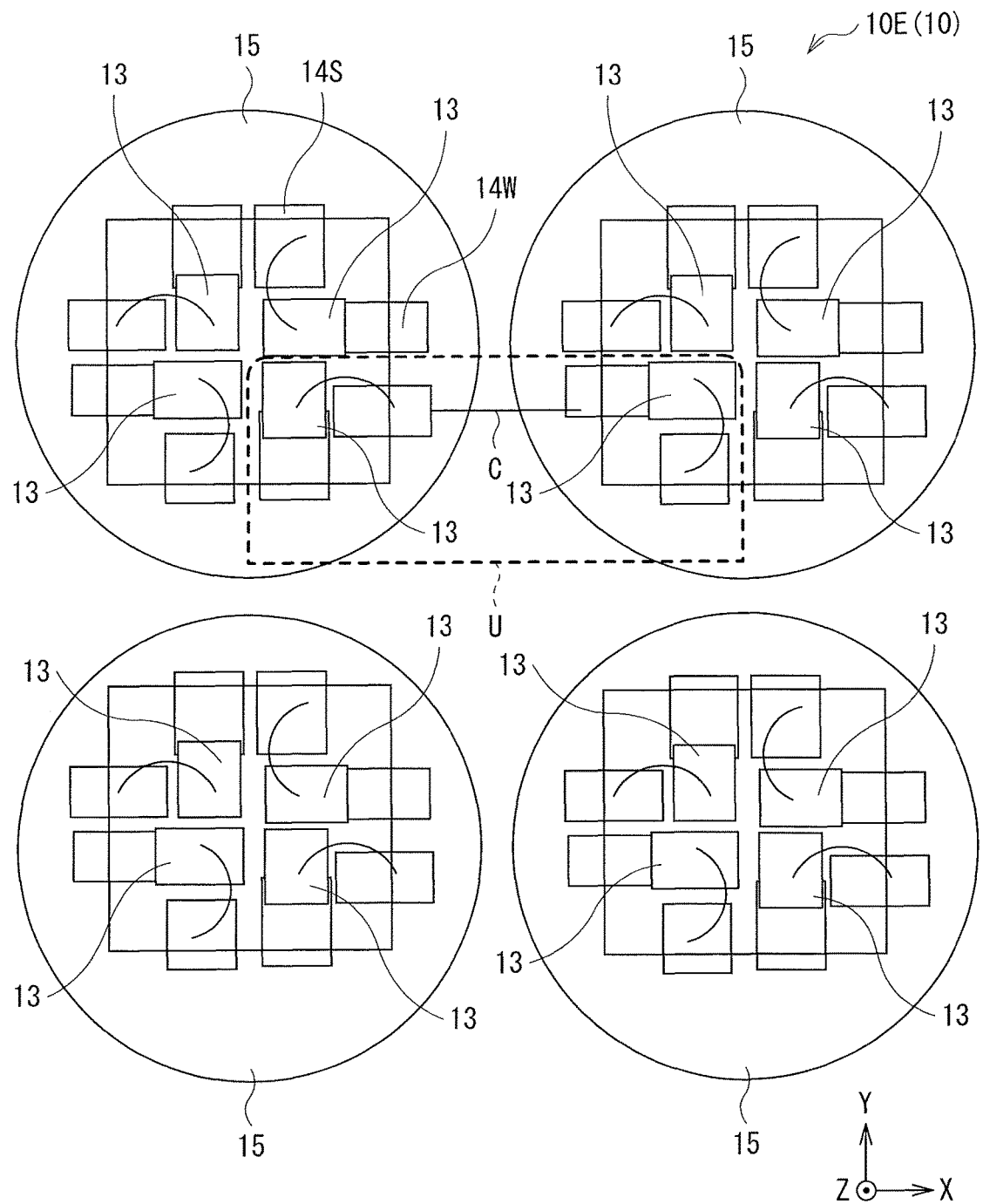

[FIG. 25]
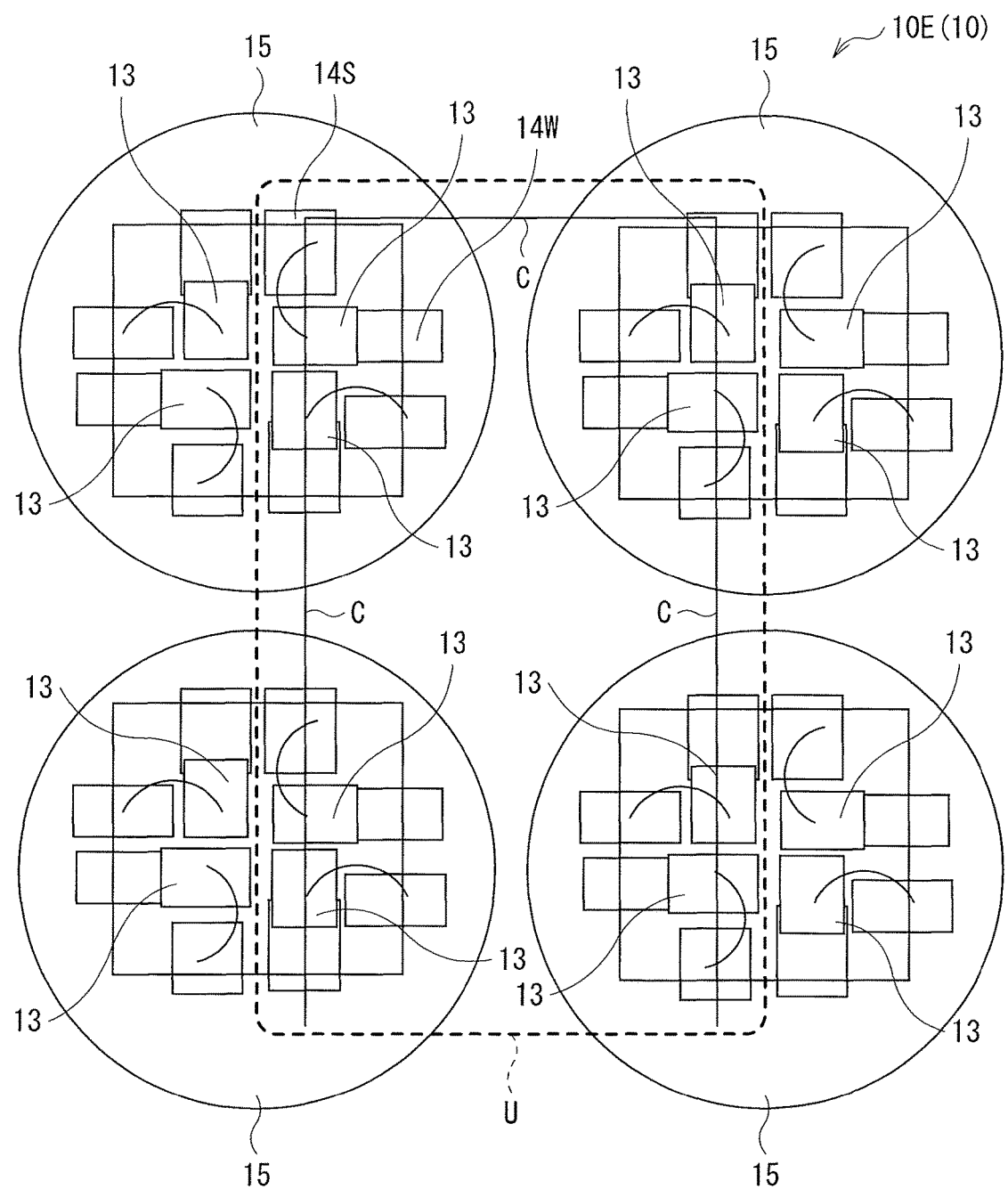

DISPLAY AND LIGHTING APPARATUS INCLUDING A LIGHT-EMITTING UNIT THAT EMITS HIGH QUALITY ILLUMINATION THROUGH ARRANGEMENTS OF LENSES AND LIGHT EMITTING DEVICES

CROSS-REFERENCE TO RELATED APPLICATIONS

This application is a national phase entry under 35 U.S.C. § 371 of International Application No. PCT/JP2018/018278 filed May 11, 2018, which claims the priority from Japanese Patent Application No. 2017-136822 filed in the Japanese Patent Office on Jul. 13, 2017, the entire contents of which are hereby incorporated by reference.

TECHNICAL FIELD

The present technology relates to a light-emitting unit having a light-emitting device such as, for example, a light-emitting diode (LED: Light-Emitting Diode), and a display and a lighting apparatus that include such a light-emitting unit.

BACKGROUND ART

A display having a liquid crystal panel is provided with a backlight (a light-emitting unit) for irradiating the liquid crystal panel with light. This backlight includes a plurality of light-emitting devices, and a lens that covers each of the light-emitting devices (for example, see PTL 1).

CITATION LIST

Patent Literature

PTL 1: Japanese Unexamined Patent Application Publication No. 2011-34770

SUMMARY OF THE INVENTION

In the light-emitting unit to be used for such a backlight and the like, it is desired to enhance the quality of illuminating light. High-quality illuminating light allows for illumination of, for example, high-contrast or high-luminance quality.

It is therefore desirable to provide a light-emitting unit that allows for emission of high-quality illuminating light, and a display and a lighting apparatus that include such a light-emitting unit.

A light-emitting unit (1) according to an embodiment of the present technology includes: a plurality of lenses; and two or more light-emitting devices covered by each of the lenses, and the two or more light-emitting devices covered by one lens of the lenses are electrically separated from each other.

A display (1) according to an embodiment of the present technology includes the above-described light-emitting unit (1) according to the embodiment of the present technology on a backside of a liquid crystal panel.

A lighting apparatus (1) according to an embodiment of the present technology includes the above-described light-emitting unit (1) according to the embodiment of the present technology.

In the light-emitting unit (1), the display (1), or the lighting apparatus (1) according to the embodiment of the present technology, the two or more light-emitting devices covered by the one lens are electrically separated from each other, which causes these two light-emitting devices to be driven independently of each other. For example, in a case where one of the two light-emitting devices turns on a light while the other turns off a light, a steep change in luminance between the two light-emitting devices is caused.

A light-emitting unit (2) according to an embodiment of the present technology includes: a substrate; a plurality of light-emitting devices provided on the substrate; a lens covering each of the light-emitting devices, and disposed to have a gap between the lens and the substrate; and a reflecting sheet provided on the substrate, having an opening for each of the lenses, and having one end in a predetermined direction. The reflecting sheet is provided with a plurality of fitting sections. Each of the fitting sections is disposed in the gap. Each of the fitting sections includes a circumferential edge on side of the one end of the opening.

A display (2) according to an embodiment of the present technology includes the above-described light-emitting unit (2) according to the embodiment of the present technology on a backside of a liquid crystal panel.

A lighting apparatus (2) according to an embodiment of the present technology includes the above-described light-emitting unit (2) according to the embodiment of the present technology.

In the light-emitting unit (2), the display (2), or the lighting apparatus (2) according to the embodiment of the present technology, each of the fitting sections of the reflecting sheet are disposed in the gap between the substrate and the lens, which causes the reflecting sheet to be fixed to the substrate with use of the fitting sections.

In the light-emitting unit (1), the display (1), and the lighting apparatus (1) according to the respective embodiments of the present technology, the two or more light-emitting devices covered by the one lens are electrically separated from each other, which makes it possible to cause a steep change in luminance between a lighting-on region and a lighting-off region. This allows for enhanced contrast of illuminating light. Further, in the light-emitting unit (2), the display (2), and the lighting apparatus (2) according to the respective embodiments of the present technology, the reflecting sheet is provided with the fitting sections, which makes it possible to fix the reflecting sheet to the substrate, for example, with a less number of fixing members such as pins or without using the fixing members. This allows for suppression of deterioration in luminance quality resulting from the fixing members. Therefore, in the light-emitting units (1) and (2), the displays (1) and (2), and the lighting apparatuses (1) and (2) according to the respective embodiments of the present technology, it is possible to emit high-quality illuminating light. It is to be noted that effects described above are not necessarily limitative, and any of effects described in the present disclosure may be provided.

BRIEF DESCRIPTION OF DRAWINGS

FIG. 1 is a schematic exploded perspective view of a configuration of a display according to a first embodiment of the present technology.

FIG. 2 is a planar schematic view of a configuration of a main part of a light source unit illustrated in FIG. 1.

FIG. 3 is a schematic view of a cross-sectional configuration taken along a line illustrated in FIG. 2.

FIG. 4 is a planar schematic view of a drive unit region of the light source unit illustrated in FIG. 2.

FIG. 5 is a cross-sectional schematic view of a configuration of a main part of a light-emitting unit according to a comparative example.

FIG. 6 Part (A) of FIG. 6 is a diagram illustrating a luminance distribution of the light-emitting unit illustrated in FIG. 5, and part (B) of FIG. 6 is a diagram illustrating a luminance distribution of the light-emitting unit illustrated in FIG. 2.

FIG. 7 is an enlarged diagram illustrating the luminance distribution illustrated in the part (B) of FIG. 6.

FIG. 8 is a diagram illustrating a relationship between a size of a lighting-on region and luminance in each of the light-emitting units illustrated in FIGS. 2 and 5.

FIG. 9 is a diagram illustrating a luminance distribution at the time of causing all of light-emitting devices to turn on a light in each of the light-emitting units illustrated in FIGS. 2 and 5.

FIG. 10 is a cross-sectional schematic view of a configuration of a main part of a light-emitting unit according to a modification example 1.

FIG. 11 is a planar schematic view of a configuration of a main part of a light-emitting unit according to a modification example 2.

FIG. 12 is a planar schematic view of a configuration of a main part of a light-emitting unit according to a modification example 3.

FIG. 13A is a planar schematic view of a configuration of a light-emitting unit according to a second embodiment of the present technology.

FIG. 13B is a schematic view of a cross-sectional configuration taken along a line A-A' illustrated in FIG. 13A.

FIG. 13C is a schematic view of a cross-sectional configuration taken along a line B-B' illustrated in FIG. 13A.

FIG. 14 is a planar schematic view of a configuration of a lens illustrated in FIG. 13B or the like.

FIG. 15A is a planar schematic view of a manufacturing process of the light-emitting unit illustrated in FIG. 13A.

FIG. 15B is a planar schematic view of a process subsequent to the process illustrated in FIG. 15A.

FIG. 16A is a schematic view of a cross-sectional configuration in the process illustrated in FIG. 15A.

FIG. 16B is a schematic view of a cross-sectional configuration in the process illustrated in FIG. 15B.

FIG. 17 is a planar schematic view of a configuration of a reflecting sheet according to a modification example 4.

FIG. 18 is a planar schematic view of a configuration of a reflecting sheet according to a modification example 5.

FIG. 19A is a planar schematic view of a manufacturing process of a light-emitting unit using the reflecting sheet illustrated in FIG. 18.

FIG. 19B is a planar schematic view of a process subsequent to the process illustrated in FIG. 19A.

FIG. 20A is a perspective view of an appearance of an electronic apparatus to which the display illustrated in FIG. 1 or the like is applied.

FIG. 20B is a perspective view of another example of the electronic apparatus illustrated in FIG. 20A.

FIG. 21 is a perspective view of an example of an appearance of a lighting apparatus to which any of the light-emitting units illustrated in FIG. 2 and the like is applied.

FIG. 22 is a perspective view of another example (1) of the lighting apparatus illustrated in FIG. 21.

FIG. 23 is a perspective view of another example (2) of the lighting apparatus illustrated in FIG. 21.

FIG. 24 is a planar schematic view of another example (1) of a drive unit region illustrated in FIG. 12.

FIG. 25 is a planar schematic view of another example (2) of the drive unit region illustrated in FIG. 12.

MODES FOR CARRYING OUT THE INVENTION

Hereinafter, some embodiments of the present technology are be described in detail with reference to the drawings. It is to be noted that description is given in the following order.
1. First Embodiment (a display in which a light-emitting unit includes two light-emitting devices covered by one lens)
2. Modification Example 1 (an example where a reflecting section is provided between two light-emitting devices)
3. Modification Example 2 (an example where a drive unit region is provided to stretch over four lenses)
4. Modification Example 3 (an example where four light-emitting devices are covered by one lens)
5. Second Embodiment (a display having a reflecting sheet provided with fitting sections)
6. Modification Example 4 (an example of a reflecting sheet having D-shaped openings)
7. Modification Example 5 (an example of a reflecting sheet having a positioning hole)

1. First Embodiment (Configuration of Display 1)

FIG. 1 illustrates an exploded perspective view of a main part of a liquid crystal display (a display 1) according to a first embodiment of the present technology. The display 1 includes a light-emitting unit (a light-emitting unit 10E) that functions as a backlight, and a liquid crystal panel 20 that is illuminated with light emitted from the light-emitting unit 10E. The liquid crystal panel 20 is sandwiched between a back-surface frame member 21 and a front-surface frame member 22. The light-emitting unit 10E is provided on a backside of the liquid crystal panel 20 (on the back-surface frame member 21 side). A bottom chassis 31 is provided on a backside of the light-emitting unit 10E.

The light-emitting unit 10E is a direct backlight, and includes a light source unit 10, a reflecting sheet 3, a diffusing plate 4, and an optical functional sheet 5 in order from the backside (a side farther away from the liquid crystal panel 20). The light source unit 10 is provided on a bottom surface of the bottom chassis 31.

FIG. 2 illustrates a schematic planar configuration of a portion of the light source unit 10. FIG. 3 illustrates a cross-sectional configuration taken along a line III III' illustrated in FIG. 2. The light source unit 10 includes a light source substrate 11 (a substrate), a package 12, a light-emitting device 13, wiring substrates 14W and 14S, a lens 15, a lens support 16, and a sealing resin 17. The light source substrate 11 is provided, for example, in contact with the bottom surface of the bottom chassis 31, and a plurality of the packages 12 is disposed, for example, in a matrix pattern on the light source substrate 11. Two light-emitting devices 13 covered with the sealing resin 17 are housed in each of the packages 12. The wiring substrates 14W and 14S are electrically coupled to the light-emitting devices 13. The lens 15 covers the package 12 in which the two light-emitting devices 13 are housed. The lens 15 is provided on the light source substrate 11 with the leg-shaped lens support 16 interposed therebetween, for example. The lenses 15 are disposed, for example, in a matrix pattern for the respective packages 12. In other words, the lens 15 is provided for each pair of the two light-emitting devices 13.

The light source substrate 11 is provided with an unillustrated wiring pattern to allow for emission control for each of drive unit regions (drive unit regions U in FIG. 4 to be described later). A drive current is supplied to the light-emitting devices 13 from this wiring pattern through the wiring substrates 14W and 14S. This allows for local emission control (local dimming) of the plurality of light-emitting devices 13. For the light source substrate 11, it is possible to use, for example, a resin-made film such as PET (polyethylene terephthalate), PEN (polyethylene naphthalate), or a fluorinated resin material on which a wiring pattern is printed. A metal film may be used in place of the resin film.

The package 12 has a recessed housing section, and the light-emitting devices 13 are disposed on a bottom surface of the recessed housing section. For example, the two light-emitting devices 13 are housed in the one package 12. Preferably, a surface of the recessed housing section of the package 12 has high reflectance to light from the light-emitting devices 13. The surface of the recessed housing section may include, for example, Ag as a material having high reflectance. Examples of a constituent material for the package 12 include heat-resistant polymer, ceramics, and the like.

The plurality of light-emitting devices 13 includes, for example, LEDs having configurations that are the same as one another. The light-emitting device 13 includes, for example, a stacked structure of an n-type cladding layer, an active layer, and a p-type cladding layer, as well as an n-side electrode that is electrically coupled to the n-type cladding layer and a p-side electrode that is electrically coupled to the p-type cladding layer. One of the n-side electrode and the p-side electrode is electrically coupled to the wiring substrate 14W, and the other is electrically coupled to the wiring substrate 14S through a bonding wire B. The two light-emitting devices 13 covered by the one lens 15 emit light in wavelength bands that are the same as each other. For example, all the light-emitting devices 13 emit light in a blue wavelength band.

In the present embodiment, the two light-emitting devices 13 covered by the one lens 15 are electrically separated from each other, and are driven independently of each other. As will hereinafter be described in detail, this makes it possible to enhance the contrast of illuminating light to be emitted from the light-emitting unit 10E to the liquid crystal panel 20.

Inside the one lens 15, the two light-emitting devices 13 are disposed side by side in a predetermined direction (a first direction, for example, an X direction in FIGS. 2 and 3). In the lenses 15 adjacent in a predetermined direction, the light-emitting devices 13 adjacent in the predetermined direction are electrically coupled to each other through a wiring line C.

FIG. 4 illustrates a drive unit region (a drive unit region U) of the light source unit 10. The two light-emitting devices 13 covered by the one lens 15 are electrically separated from each other; therefore, the two drive unit regions U that are independent of each other are formed inside the one lens 15. In other words, it is possible to apply effective currents that are different from each other in magnitude to the two light-emitting devices 13 (the drive unit regions U) covered by the one lens 15, and the two light-emitting devices 13 are driven independently of each other. Further, by electrically coupling the mutually adjacent light-emitting devices 13 to each other in the lenses 15 adjacent in a predetermined direction, the drive unit region U is formed that stretches over the two lenses 15 adjacent in the predetermined direction.

Each of the wiring substrates 14W and 14S serves to electrically couple the light-emitting devices 13 and the light source substrate 11 to each other, and includes, for example, a lead frame. The sealing resin 17 that covers the light-emitting devices 13 is filled in the housing section of the package 12. The sealing resin 17 has, for example, functions of protecting the light-emitting devices 13 and improving extraction efficiency of light emitted from the light-emitting devices 13. For the sealing resin 17, it is possible to use a resin material such as a silicon resin, for example.

Each of the plurality of lenses 15 covers the two light-emitting devices 13 that are electrically separated from each other. The lens 15 is disposed to be opposed to the light source substrate 11, and a gap S is provided by the lens support 16 between the lens 15 and the light source substrate 11. A planar (for example, X-Y planar in FIG. 2) shape of the lens 15 is, for example, a circle. The lens 15 includes a light entering surface S1 where light emitted from the light-emitting devices 13 enters, and a light output surface S2 that outputs the light entering from the light entering surface S1 toward the reflecting sheet 3 or the diffusing plate 4. The light entering surface S1 is disposed, for example, at a middle portion of the lens 15, and is provided in a shape of being recessed toward the light output surface S2 side as compared with a periphery. The light output surface S2 has, for example, a recess S2R that is recessed toward the light entering surface S1 side at a position opposed to the light entering surface S1. On the periphery of the recess S2R, the light output surface S2 includes a curved surface with a fixed curvature. Providing the lens 15 with the light output surface S2 having such a recess S2R allows the light emitted immediately above from the light-emitting devices 13 to be diffused more effectively.

The leg-shaped lens support 16 is provided on a surface opposite to the light source substrate 11 of the lens 15, and is disposed at a position away from the light entering surface S1 of the lens. The lens support 16 is provided in a manner of, for example, being integrated with the lens 15. For example, the three lens supports 16 are provided per lens 15, and these lens supports 16 are disposed at rotationally symmetrical positions relative to a center of the lens 15 as an axis.

The reflecting sheet 3 is provided to be opposed to the light source substrate 11, and is fixed to the light source substrate 11. The reflecting sheet 3 has a quadrangular shape with a size substantially the same as a size of the light source substrate 11, for example. The reflecting sheet 3 includes, for example, openings (for example, first openings MA and second openings MB in FIG. 13A to be described later) corresponding to the respective lenses 15. The reflecting sheet 3 includes, for example, a resin material such as polyethylene terephthalate (PET) and polycarbonate (PC), or a metal material such as aluminum (Al). The reflecting sheet 3 reflects light outputted from the light output surface S2 of the lens 15 to cause such light to enter the diffusing plate 4.

The diffusing plate 4 is provided to be opposed to one surface (a surface on the liquid crystal panel 20 side of the reflecting sheet 3) of the reflecting sheet 3. The diffusing plate 4 has a quadrangular shape with a size substantially the same as the size of the reflecting sheet 3. Light having entered the diffusing plate 4 is diffused inside the diffusing plate 4 to uniformize in-plane luminance and the like. Such uniformized light enters the liquid crystal panel 20 through the optical functional sheet 5. The diffusing plate 4 includes a resin material such as, for example, an acrylic resin and a polycarbonate resin.

The optical functional sheet 5 that is provided between the diffusing plate 4 and the liquid crystal panel 20 includes, for example, a polarizing film, a phase difference film, a diffusing film, and the like. A plurality of the optical functional sheets 5 may be provided. The optical functional sheet 5 may be, for example, a wavelength conversion sheet. The optical functional sheet 5 includes a wavelength conversion substance such as, for example, a phosphor, a quantum dot. The wavelength conversion substance is excited by light emitted from the light-emitting devices 13 to discharge light that is different in wavelength band from the light emitted from the light-emitting devices 13. For example, the wavelength conversion sheet is excited by light in the blue wavelength band that is emitted from the light-emitting devices 13 to discharge light in a red wavelength band and a green wavelength band.

The liquid crystal panel 20 is a transmissive liquid crystal panel that displays motion images or still images. The liquid crystal panel 20 is provided to be opposed to the optical functional sheet 5, and includes, for example, a TFT substrate, a liquid crystal layer, and a color filter substrate in this order from a position closer to the optical functional sheet 5. The liquid crystal panel 20 may be further provided with a polarizing plate and the like. For example, light emitted from the light-emitting unit 10E enters the TFT substrate, and is outputted from the color filter substrate side through the liquid crystal layer.

The back-surface frame member 21 and the front-surface frame member 22 between which the liquid crystal panel 20 is sandwiched are frame-shaped members that cover a circumferential edge of the liquid crystal panel 20. The back-surface frame member 21 and the front-surface frame member 22 serve to protect the circumferential edge of the liquid crystal panel 20, and to improve an aesthetic appearance. The back-surface frame member 21 and the front-surface frame member 22 include a metal material such as, for example, Al (aluminum).

The bottom chassis 31 is adhered to a back surface of the light source substrate 11 (a surface opposite to a surface on which the light-emitting devices 13 are provided) with, for example, an adhesive sheet interposed therebetween. The bottom chassis 31 includes, for example, a plate-like portion adhered to the light source substrate 11, and a wall portion provided on an outer periphery of the plate-like portion. The plate-like portion of the bottom chassis 31 maintains flatness of the light source substrate 11, and the wall portion of the bottom chassis 31 is combined with the back-surface frame member 21. The bottom chassis 31 includes, for example, a metal material such as Fe (iron) or Al (aluminum), glass, or the like.

(Operation of Display 1)

In the display 1, light generated in the light-emitting devices 13 enters the light entering surface S1 of the lens 15 through the sealing resin 17. Such light is outputted from the light output surface S2 of the lens 15, and thereafter is reflected by the reflecting sheet 3 to enter the diffusing plate 4. In the diffusing plate 4, the light having entered the diffusing plate 4 is diffused uniformly. The light diffused by the diffusing plate 4 enters the liquid crystal panel 20 through the optical functional sheet 5. The light having entered the liquid crystal panel 20 passes through the liquid crystal layer while being modulated for each of pixels on the basis of an applied image voltage. The light having passed through the liquid crystal layer passes through a color filter (not illustrated), thereby being extracted as color display light.

(Workings and Effects of Light-Emitting Unit 10E)

In the light-emitting unit 10E that configures a backlight of the display 1, the one lens 15 covers the two light-emitting devices 13, and these two light-emitting devices 13 are electrically separated from each other. Accordingly, as illustrated in FIG. 4, the two drive unit regions U are formed inside the one lens 15. In the light-emitting unit 10E, local dimming control is performed for each of the drive unit regions U in response to an inputted image signal. For example, the one of the two light-emitting devices 13 (the drive unit regions U) covered by the one lens 15 is caused to turn on a light, while the other light-emitting device 13 (the drive unit region U) is caused to turn off a light. At this time, a steep change in luminance takes place between the light-emitting device 13 remaining in a lighting-on state and the light-emitting device 13 remaining in a lighting-off state that are disposed inside the one lens 15. Driving the two light-emitting devices 13 covered by the one lens 15 independently of each other in such a manner makes it possible to enhance the contrast of illuminating light that enters the liquid crystal panel 20 from the light-emitting unit 10E. This is described below.

FIG. 5 illustrates a schematic cross-sectional configuration of a main part of a light-emitting unit (a light-emitting unit 100) according to a comparative example. In the light-emitting unit 100, a single light-emitting device (a light-emitting device 130) is housed in the one package 12, and one lens 150 covers the single light-emitting device 130. The light-emitting unit 100 is subjected to the local dimming control, and the number of the light-emitting devices 130 is smaller than the number of pixels of a liquid crystal panel.

In the light-emitting unit 100, light emitted from the light-emitting device 130 is diffused in plane by use of, for example, the lens 150, a diffusing plate, and the like. This uniformizes the luminance and the like in plane, thereby maintaining luminance quality in an image having a large lighting-on region. However, in the light-emitting unit 100 with the smaller number of the light-emitting devices 130, as the lighting-on region is made smaller, the luminance is also reduced accordingly. Therefore, in an image in which most of the light-emitting devices 130 are put in a lighting-off state, and just a small number of the light-emitting devices 130 are put in a lighting-on state, it becomes difficult to achieve high contrast. Examples of the image in which most of the light-emitting devices 130 are put in the lighting-off state, and just a small number of the light-emitting devices 130 are put in the lighting-on state include an image of, for example, "stars in the night sky", and the like. Further, in the light-emitting unit 100, so-called halo and the like is easily generated.

As a method of enhancing the contrast of the light-emitting unit 100, it is also considered to use a special reflecting sheet such as a shaped reflecting sheet. However, such a case results in an increase in costs that is caused due to the special reflecting sheet. Further, the reflecting sheet is more likely to vary in shape, which poses a possibility that the luminance quality will deteriorate.

In contrast, in the light-emitting unit 10E, the two light-emitting devices 13 covered by the one lens 15 are driven independently of each other. In a case where such a light-emitting unit 10E is subjected to the local dimming control, if one of the two light-emitting devices 13 covered by the one lens 15 is caused to turn on a light, while the other light-emitting device 13 is caused to turn off a light, a steep change in luminance takes place between the light-emitting device 13 remaining in the lighting-on state and the light-emitting device 13 remaining in the lighting-off state that are disposed inside the one lens 15.

FIG. 6 illustrates results of comparing light emitted from the light-emitting unit 10E with light emitted from the light-emitting unit 100. Part (A) of FIG. 6 illustrates a luminance distribution of the light emitted from the light-emitting unit 100, and part (B) of FIG. 6 illustrates a luminance distribution of the light emitted from the light-emitting unit 10E. The part (B) of FIG. 6 illustrates the luminance distribution in a state where one of the two light-emitting devices 13 covered by the one lens 15 is caused to turn on a light, while the other light-emitting device 13 is caused to turn off a light. It can be seen from FIG. 7 that a peak shape of the luminance distribution of the light emitted from the light-emitting unit 10E is sharper as compared with the case of the light-emitting unit 100, and that a steep change in luminance takes place between the light-emitting device 13 remaining in the lighting-on state and the light-emitting device 13 remaining in the lighting-off state. This is attributable to characteristics of the lens 15.

FIG. 7 illustrates an enlarged view of the luminance distribution in the part (B) of FIG. 6. A peak shape of this luminance distribution is asymmetric, and the left side of a peak position (a side on which positional coordinates are smaller) is steep, and the right side (a side on which positional coordinates are larger) is comparatively broader. In other words, the luminance distribution of light to be extracted from the light output surface S2 of the lens 15 varies depending on a direction. With the help of such characteristics of the lens 15, if one of the two light-emitting devices 13 covered by the one lens 15 is caused to turn on a light, while the other light-emitting device 13 is caused to turn off a light, a steep change in luminance takes place between those light-emitting devices 13, leading to achievement of high contrast. Further, it is less likely that the halo and the like will be generated.

FIG. 8 illustrates a relationship between a size of a lighting-on region and luminance in the light-emitting unit 10E and the light-emitting unit 100. It can be seen that, as compared with the light-emitting unit 100, the light-emitting unit 10E maintains high luminance even if the lighting-on region is made smaller.

FIG. 9 illustrates a luminance distribution at the time of causing all of the light-emitting devices 13 and 130 to turn on a light in the light-emitting unit 10E and the light-emitting unit 100. As seen from FIG. 9, the light-emitting unit 10E maintains luminance quality even in an all-lighting-on state.

In such a manner, in the light-emitting unit 10E, the two light-emitting devices 13 covered by the one lens 15 are electrically separated from each other, and are driven independently of each other, which makes it possible to achieve high contrast in an image having a small lighting-on region (for example, an image of "stars in the night sky") while maintaining luminance quality in an image having a large lighting-on region. Further, it is not necessary to use a special reflecting sheet, which avoids an increase in costs and deterioration in luminance quality that are caused by use of the special reflecting sheet.

As described above, in the light-emitting unit 10E, the two light-emitting devices 13 covered by the one lens 15 are electrically separated from each other, which makes it possible to cause a steep change in luminance between a lighting-on region and a lighting-off region. This makes it possible to enhance the contrast of illuminating light to the liquid crystal panel 20. In other words, it is possible for the light-emitting unit 10E to emit high-quality illuminating light.

Hereinafter, description is provided on modification examples of the above-described embodiment, and another embodiment; however, in the subsequent description, any component parts essentially same as those in the above-described embodiment are denoted with the same reference numerals, and description thereof is omitted as appropriate.

Modification Example 1

FIG. 10 schematically illustrates a cross-sectional configuration of a main part of a light-emitting unit 10E (or a light source unit 10) according to a modification example 1 of the above-described embodiment. In such a manner, between the two light-emitting devices 13 covered by the one lens 15 (not illustrated in FIG. 11), a reflecting section (a reflecting section 18) may be provided that separates these light-emitting devices 13. Except for this point, the light-emitting unit 10E of the modification example 1 has a configuration and effects similar to those of the light-emitting unit 10E of the above-described embodiment.

The reflecting section 18 is provided, for example, in a wall shape that partitions a housing section of the package 12. A height h (for example, a length in a Z direction from a bottom surface of the package 12) of the reflecting section 18 is greater than a thickness t of the sealing resin 17. The height h of the reflecting section 18 may be equal to, or smaller than the thickness t of the sealing resin 17. As a constituent material of the reflecting section 18, it is possible to use the same material as a constituent material of the package 12. The reflecting section 18 may be integrated with the package 12.

By providing such a reflecting section 18, a change in luminance between the two light-emitting devices 13 becomes steeper if one of the two light-emitting devices 13 covered by the one lens 15 is caused to turn on a light, while the other light-emitting device 13 is caused to turn off a light. This makes it possible to further enhance the contrast of illuminating light emitted from the light-emitting unit 10E.

Modification Example 2

FIG. 11 schematically illustrates a planar configuration of a main part of a light-emitting unit 10E according to a modification example 2 of the above-described embodiment. In such a manner, the drive unit region U may stretch over four lenses 15. Except for this point, the light-emitting unit 10E of the modification example 2 has a configuration and effects similar to those of the light-emitting unit 10E of the above-described embodiment.

In the present modification example, in the two lenses 15 adjacent to each other in a direction (a second direction, for example, a Y direction in FIG. 12) intersecting with a predetermined direction, the adjacent light-emitting devices 13 are electrically coupled to each other through the wiring line C. Further, in the lenses 15 adjacent to each other in the predetermined direction (for example, an X direction in FIG. 12), at least one of the electrically coupled light-emitting devices 13 is electrically coupled to the light-emitting device 13 adjacent thereto through the wiring line C. In such a manner, the drive unit region U is formed that stretches over the four (2×2) lenses 15 adjacent to each other in the X direction and the Y direction. At this time, in the drive unit region U, a length DX in the X direction is preferably greater than a length DY in the Y direction. This makes it possible to enhance luminance at the time of reduction in a size of the lighting-on region (see FIG. 8). For example, the light-emitting devices 13 are disposed at a constant density.

Modification Example 3

FIG. 12 schematically illustrates a planar configuration of a main part of a light-emitting unit 10E according to a modification example 3 of the above-described embodiment. In such a manner, the four light-emitting devices 13 that are electrically separated from one another may be covered by the one lens 15. Except for this point, the light-emitting unit 10E of the modification example 3 has a configuration and effects similar to those of the light-emitting unit 10E of the above-described embodiment.

The four light-emitting devices 13 covered by the one lens 15 are disposed in such a manner that, for example, the two are provided side by side in each of the X direction and the Y direction. The four light-emitting devices 13 covered by the one lens 15 are electrically separated from one another. For example, in the lenses 15 adjacent to each other in the X direction, the adjacent light-emitting devices 13 are electrically coupled to each other through the wiring line C. Further, in the lenses 15 adjacent to each other in the Y direction, at least one of the electrically coupled light-emitting devices 13 is electrically coupled to the light-emitting device 13 adjacent thereto through the wiring line C. Covering the four light-emitting devices 13 by the one lens 15 in such a manner makes it possible to form four drive unit regions U inside the one lens 15. The drive unit region U is formed to stretch over the four (2×2) lenses 15 adjacent to each other in the X direction and the Y direction. An increase in the number of the light-emitting devices 13 covered by the one lens 15 allows for enhancement of the contrast among the light-emitting devices 13 disposed side by side in the Y direction in addition to the X direction. This makes it possible to enhance luminance at the time of reduction in a size of the lighting-on region (see FIG. 8).

Second Embodiment

Each of FIGS. 13A to 13C schematically illustrates a configuration of a main part of a light-emitting unit (a light-emitting unit 60E) according to a second embodiment of the present technology. FIG. 13A illustrates a schematic planar configuration of the light-emitting unit 60E; and FIG. 13B illustrates a cross-sectional configuration taken along a line B-B' illustrated in FIG. 13A; and FIG. 13C illustrates a cross-sectional configuration taken along a line B-B' illustrated in FIG. 13A.

As with the above-described light-emitting unit 10E, the light-emitting unit 60E includes a plurality of light-emitting devices 13 that is provided on the light source substrate 11; the lens 15 that covers the light-emitting device 13; and the reflecting sheet 3 opposed to the light source substrate 11. The package 12 that houses the light-emitting device 13, and the sealing resin 17 are not illustrated in FIGS. 13A to 13C.

In the light-emitting unit 60E, for example, the one lens 15 covers the single light-emitting device 13. As with the light-emitting unit 10E of the above-described first embodiment, the two light-emitting devices 13 that are electrically separated from each other may be covered by the one lens 15.

The lens 15 is provided to be opposed to the light source substrate 11, and is fixed to the light source substrate 11 by the leg-shaped lens support 16. The gap S is provided by the lens support 16 between the lens 15 and the light source substrate 11. The gap S is about 1 mm, for example.

FIG. 14 illustrates an example of a planar shape of the lens 15. The lens 15 has a substantially circular planar shape; however, a projected section 15P is provided on a circumferential edge of the circular shape. The projected section 15P is a portion where the circumferential edge of the lens 15 is projected to outside. For example, the three projected sections 15P are provided for one lens 15, and are disposed at positions that are rotationally symmetric relative to the center of the lens 15 as an axis.

Each of the projected sections 15P of the lens 15 is preferably provided with a sloped portion 15S (FIGS. 13B and 13C). The sloped portion 15S is a portion where a surface opposed to the light source substrate 11 of the projected section 15P is sloped relative to the light source substrate 11, and such a slope is provided in a direction in which the gap S becomes greater gradually toward outside. Providing such projected sections 15P and such a sloped portion 15S on the lens 15 makes it easy to form a fitting section (a fitting section 3E) of the reflecting sheet 3 to be described later.

The reflecting sheet 3 has a planar shape of a quadrangle such as, for example, a rectangle, and two opposed sides of the quadrangle (for example, two sides that are opposed in the Y direction in FIG. 13A) configure one end (one end E1) and another end (another end E2). For example, one side in an upper direction in FIG. 13A configures the one end E1.

The reflecting sheet 3 is provided with a first opening MA or second opening MB having a circular shape for each of the lenses 15, and the lens 15 is exposed from the first opening MA or the second opening MB. The first opening MA and the second opening MB are different in, for example, shape or size. For example, a diameter DA of the first opening MA is greater than a diameter DB of the second opening MB. The reflecting sheet 3 is provided with, for example, the first openings MA that are larger in number than the second openings MB. For example, only one row closest to the one end E1 includes the second openings MB, and remaining rows (three rows in FIG. 13A) include the first openings MA.

In the present embodiment, the reflecting sheet 3 is provided with a plurality of fitting sections (fitting sections 3E) (FIG. 13B). The fitting section 3E is a section that is a portion, disposed in the gap S, on the one end E1 side of a circumferential edge of each of the first openings MA. The first openings MA are different from one another. As described later, the fitting section 3E is formed by sliding the reflecting sheet 3 relative to the light source substrate 11. For example, in all of the first openings MA, a portion of the circumferential edge on the one end E1 side is inserted into the gap S to form the fitting section 3E. With use of the plurality of fitting sections 3E, the reflecting sheet 3 is fixed to the light source substrate 11. As will hereinafter be described in detail, this allows for enhancement of the luminance quality of illuminating light emitted from the light-emitting unit 60E.

At least one of the projected sections 15P and at least one of the sloped portions 15S of the lens 15 are provided at a position opposed to the fitting section 3E, that is, on the one end E1 side of the reflecting sheet 3. Inserting the reflecting sheet 3 into the gap S from a direction in which the sloped portion 15S is provided makes it easy to bring the reflecting sheet 3 in the gap S. Further, providing the projected section 15P at a position opposed to the fitting section 3E makes it hard for the reflecting sheet 3 to comm off the gap S.

The second opening MB is provided to serve for alignment in sliding the reflecting sheet 3 relative to the light source substrate 11. In the second opening MB, a whole circumferential edge is disposed on an outside of the lens 15. For example, the circumferential edge of the second opening MB may overlap with the projected section 15P of the lens 15. Any burr of a cutting surface that arises in forming the first opening MA and the second opening MB is directed to the light source substrate 11, for example.

The reflecting sheet 3 includes, for example, biaxial stretched polyethylene terephthalate (PET). A thickness (for example, a length in the Z direction in FIG. 13B or FIG. 13C) of the reflecting sheet 3 is about 0.25 mm, for example. The reflecting sheet 3 may be provided with a hole, a notch, and the like for inserting a pin for alignment (not illustrated).

The reflecting sheet 3 is fixed to the light source substrate 11 in the following manner, for example (FIGS. 15A to 16B).

FIG. 15A is a plan view of a state prior to fixing the reflecting sheet 3 to the light source substrate 11, and FIG. 16A illustrates a cross-sectional configuration in such a state. For example, the reflecting sheet 3 is disposed to be floated on the one end E1 side from the light source substrate 11. At this time, a portion of the circumferential edge of the second opening MB of the reflecting sheet 3 overlaps with the lens 15.

From this state, the reflecting sheet 3 is slid relative to the light source substrate 11 in an arrow direction (in a downward direction of a paper surface in FIG. 15A) while moving it closer to the light source substrate 11. As a result, the circumferential edge on the one end E1 side of the first opening MA of the reflecting sheet 3 slips into the gap S to be inserted (FIGS. 15B and 16B). The reflecting sheet 3 is inserted into the gap S through, for example, the sloped portion 15S of the lens 15. In such a manner, the fitting section 3E is formed, and the reflecting sheet 3 is fixed to the light source substrate 11. In the second opening MB, the circumferential edge moves to the outside of the lens 15 to perform alignment. The reflecting sheet 3 may be fixed to the light source substrate 11 by using a double-sided adhesive tape only for a peripheral region of one row in which the second openings MB are disposed. FIGS. 15B and 16B illustrate states after sliding the reflecting sheet 3 in the arrow direction from the states in FIGS. 15A and 16A, respectively.

After the fitting section 3E is formed, the reflecting sheet 3 may be fixed to the light source substrate 11 by further using a pin and the like for supporting the diffusing plate 4.

In the light-emitting unit 60E of the present embodiment, in the reflecting sheet 3, the circumferential edge on the one end E1 side of each of the first openings MA that are different from one another is inserted into the gap S to form the fitting section 3E. This causes the reflecting sheet 3 to be fixed to the light source substrate 11, which allows for suppression of deterioration in luminance quality that is caused by a fixing member such as a pin. This is described below.

As a method of fixing a reflecting sheet to a light source substrate, for example, a method of using a pin is considered. In such a method of using the pin, it is necessary to put in many pins, because if the number of pins is small, the reflecting sheet floats from a fixing substrate due to heat, distortion of an enclosure, and the like, resulting in deterioration in luminance. However, using many pins poses a possibility that the luminance quality will deteriorate due to shadows of the pins. Further, for example, the reflecting sheet that includes biaxial stretched PET is liable to shrinkage and expansion due to variation in temperature; therefore, if many positions are fixed with the pins, there is a possibility that significant stress will be locally applied to a portion of the reflecting sheet. Such stress degrades the reliability of a light-emitting unit. Further, in consideration of a change in shape that is caused by variation in temperature, and an assembly error, a size of an opening of the reflecting sheet is set to be significantly greater than a diameter of a lens, which deteriorates reflectance at an opening portion of the reflecting sheet, resulting in deterioration in luminance efficiency.

Other than the pins, it is also possible to use a material such as a double-sided adhesive tape, a push rivet, a screw; however, a method of using such fixing members involves costs resulting from a material cost and an assembly cost (assembly man-hours). Further, making of a hole to a back-surface side of an enclosure, and the like have an influence on design.

In contrast, in the present embodiment, the reflecting sheet 3 is provided with the fitting section 3E in which the circumferential edge on the one end E1 side of each of the first openings MA is inserted into the gap S, and thus the reflecting sheet 3 is fixed to the light source substrate 11 with use of the fitting section 3E. In other words, even if the number of fixing members such as pins is reduced, or without using the fixing member, the reflecting sheet 3 is fixed to the light source substrate 11. This allows for suppression of deterioration in luminance quality that is caused by a shadow of a pin, and the like.

Further, the fitting section 3E is provided on the circumferential edge on the one end E1 side of each of the first openings MA, that is, in a portion of the reflecting sheet 3; therefore, remaining portions are displaced flexibly depending on shrinkage and expansion of the reflecting sheet 3. Accordingly, local stress is less likely to be applied to the reflecting sheet 3, which causes reliability of the light-emitting unit 60E to be maintained.

Moreover, in the reflecting sheet 3, any portions other than the fitting section 3E are displaced flexibly depending on shrinkage and expansion, which makes it possible to bring sizes of the first opening MA and the second opening MB closer to a diameter of the lens 15. This makes it possible to suppress reduction in reflectance in the vicinity of the first opening MA and the second opening MB of the reflecting sheet 3, thereby allowing for improvement of luminance efficiency.

In addition, it is possible to fix the reflecting sheet 3 to the light source substrate 11 with a less number of fixing members such as pins, or without using the fixing members, which makes it possible to reduce a material cost and an assembly cost (assembly man-hours) that result from the fixing members. This allows for cost reduction. Further, hole-making and the like are also unnecessary, which has no influence on design.

As described above, in the present embodiment, the reflecting sheet 3 is provided with the fitting section 3E, which makes it possible to fix the reflecting sheet 3 to the light source substrate 11 with a less number of fixing members such as pins, or without using the fixing members, for example. This allows for suppression of deterioration in luminance quality resulting from the fixing members. Accordingly, it is possible for the light-emitting unit 60E to emit high-quality illuminating light.

Modification Example 4

FIG. 17 schematically illustrates a planar configuration of the reflecting sheet 3 according to a modification example (a modification example 4) of the above-described second embodiment. In such a manner, the first opening MA may take a D-shaped form. Except for this point, the reflecting sheet 3 of the modification example 4 has a configuration and effects similar to those of the reflecting sheet 3 of the above-described second embodiment.

In the first opening MA of the reflecting sheet 3, the circumferential edge on the one end E1 side is straight, and a remaining portion is circularly curved. The fitting section 3E (FIG. 13B) is formed in such a straight circumferential edge portion of the first opening MA. Accordingly, in a case where the reflecting sheet 3 comes in contact with the projected section 15P of the lens 15 at the time of sliding, by making the circumferential edge on the one end E1 side of the first opening MA straight, the fitting section 3E is formed without getting stuck with other portions of the lens 15.

Modification Example 5

FIG. 18 schematically illustrates a planar configuration of the reflecting sheet 3 according to a modification example (a modification example 5) of the above-described second embodiment. In such a manner, the first openings MA may be provided for all the lenses 15 without providing second openings for alignment (the second openings MB in FIG. 13B). In other words, the circumferential edges on the one end E1 side of all openings (the first openings MA) may be fitted to the gap S. Except for this point, the reflecting sheet 3 of the modification example 5 has a configuration and effects similar to those of the reflecting sheet 3 of the above-described second embodiment.

The reflecting sheet 3 may be provided with a positioning hole (a positioning hole H3). The positioning hole H3 serves to adjust a position of the reflecting sheet 3 relative to the light source substrate 11 after sliding the reflecting sheet 3. Providing the positioning hole H3 makes it possible to stabilize a sliding amount in sliding the reflecting sheet 3.

FIG. 19A is a plan view of a state prior to fixing the reflecting sheet 3 to the light source substrate 11. For example, the reflecting sheet 3 is disposed to be floated on the one end E1 side from the light source substrate 11. At this time, the positioning hole H3 of the reflecting sheet 3 is disposed to be shifted from, for example, a pin hole HP for inserting a pin provided on the light source substrate 11. The pin hole HP may be provided on the bottom chassis 31 and the like. The pin to be inserted into the pin hole HP is provided to keep a distance between the light source unit 10 and the diffusing plate 4, for example, and includes a resin material, for example. The pin is transparent, white, or the like.

From this state (FIG. 19A), the reflecting sheet 3 is slid relative to the light source substrate 11 in an arrow direction (in a downward direction of a paper surface in FIG. 19A) while being moved closer to the light source substrate 11 (FIG. 19B). As a result, the circumferential edge on the one end E1 side of the first opening MA of the reflecting sheet 3 slips into the gap S to form the fitting section 3E (see FIG. 16B). The positioning hole H3 moves to a position overlapping with the pin hole PH. The reflecting sheet 3 is fixed to the light source substrate 11 by forming the fitting section 3E, and by inserting the pin into the positioning hole H3 and the pin hole PH that overlap with each other.

By sliding the reflecting sheet 3, the positioning hole H3 may be brought into contact with a pin inserted beforehand. Alignment of the reflecting sheet 3 relative to the light source substrate 11 is performed by contact of such a pin with the positioning hole H3.

Application Example: Electronic Apparatus

Hereinafter, description is provided on an application example of the display 1 described above to an electronic apparatus. Examples of the electronic apparatus include a television apparatus, a medical monitor, a digital signage display, a master monitor, a digital camera, a notebook personal computer, a mobile terminal such as a mobile phone, a video camera, and the like. In other words, the above-described display 1 is applicable to electronic apparatuses in every field that display image signals to be inputted externally or internally generated image signals as images or moving images.

Each of FIG. 20A and FIG. 20B illustrates an appearance of a tablet terminal to which the display 1 of any of the above-described embodiments is applied. This tablet terminal has, for example, a display section 710 and a non-display section 720, and the display section 710 includes the display 1 of any of the above-described embodiments.

Application Example: Lighting Apparatus

FIG. 21 illustrates an appearance of a lighting apparatus to which any of the above-described light-emitting units 10E and 60E is applied. This lighting apparatus is a tabletop lighting apparatus that includes any of the light-emitting units 10E and 60E of the above-described first and second embodiments, and for example, a lighting section 843 is attached to a supporting post 842 provided on a base mount 841. The lighting section 843 includes any of the light-emitting units 10E and 60E of the above-described first and second embodiments. It is possible for the lighting section 843 to take any form, such as a cylindrical shape illustrated in FIG. 21 or a curved shape illustrated in FIG. 22.

Any of the light-emitting units 10E and 60E may be applied to an indoor lighting apparatus as illustrated in FIG. 23. In this lighting apparatus, a lighting section 844 includes any of the above-described light-emitting units 10E and 60E. The appropriate number of the lighting sections 844 are disposed at an appropriate interval on a ceiling 850A of a building. It is to be noted that installation locations of the lighting sections 844 are not limited to the ceiling 850A, but the lighting sections 844 may be installed at any location such as a wall 850B or a floor (not illustrated) depending on the intended use.

These lighting apparatuses perform lighting using light from any of the light source unit 10E and 60E. Here, as described in the above-described first and second embodiments, it is possible to obtain the high-quality illuminating light from any of the light-emitting units 10E and 60E.

Although the present technology has been described hereinabove with reference to the embodiments and the modification examples, the present technology is not limited to the foregoing embodiments, etc., and may be modified in a variety of ways. For example, a position, a shape, and the like of each of the component parts described in the above embodiments, etc. are mere examples and non-limiting.

Further, dimensions, a dimension ratio, a shape, and the like of each of the component parts that are illustrated in each of the drawings are mere examples, and non-limiting.

In addition, in the above embodiments and the like, description has been given of a case where the lens 15 is provided away from the light-emitting device 13 (in a case of a so-called secondary lens); however, the lens 15 may be provided in contact with the light-emitting device 13.

Moreover, in the above embodiments and the like, description has been given of a case where the lenses 15 are disposed in a matrix pattern; however, the lenses 15 may be disposed in any pattern, and for example, may be arranged in a honeycomb structure.

Further, in FIG. 12 (the modification example 3), description has been given of a case where, in the lenses 15 adjacent to each other in the X direction and the Y direction, the adjacent light-emitting devices 13 are electrically coupled to each other; however, for example, as illustrated in FIG. 24, in the lenses 15 adjacent to each other in one (the X direction in FIG. 24) of the X direction and the Y direction, the adjacent light-emitting devices 13 may be electrically coupled to each other. Alternatively, as illustrated in FIG. 25, the light-emitting devices 13 adjacent to each other in one (the Y direction in FIG. 25) of the X direction and the Y direction inside the one lens 15 may be electrically coupled to each other.

In addition, in the above embodiments and the like, description has been given of a case where the light-emitting device 13 includes an LED; however, the light-emitting device 13 may include a semiconductor laser or the like.

Moreover, the sealing resin may include a waveform conversion substance. Alternatively, a waveform conversion sheet may be provided between the light-emitting device 13 and the lens 15.

Further, in the above embodiments, detailed description has been given of configurations of the light-emitting units 10E and 60E, the display 1, and the like; however, it is not necessary to provide all of the component parts, or any other component parts may be further provided.

Additionally, a material and the like of each of the component parts described in the above embodiments are not limitative, and any of other materials may be provided.

It is to be noted that the effects described herein are merely exemplified and non-limiting, and other effects may be provided.

The present technology may be configured as follows.

(1)
A light-emitting unit including:
a plurality of lenses; and
two or more light-emitting devices covered by each of the lenses,
the two or more light-emitting devices covered by one lens of the lenses being electrically separated from each other.

(2)
The light-emitting unit according to (1), in which wavelength bands of light emitted from the two or more light-emitting devices covered by the one lens are same as each other.

(3)
The light-emitting unit according to (1) or (2), in which the two or more light-emitting devices covered by the one lens are allowed to pass effective currents therethrough, the effective currents being different in magnitude from each other.

(4)
The light-emitting unit according to any one of (1) to (3), in which the two or more light-emitting devices covered by the one lens are disposed side by side in a first direction, and the light-emitting devices disposed adjacently in lenses adjacent in the first direction of the lenses are electrically coupled to each other.

(5)
The light-emitting unit according to (4), in which the light-emitting devices disposed adjacently in the lenses adjacent in a second direction are electrically coupled to each other, the second direction intersecting with the first direction.

(6)
The light-emitting unit according to claim 1, in which four of the light-emitting devices are covered by the one lens.

(7)
The light-emitting unit according to any one of (1) to (6), further including a package a package housing the two or more light-emitting devices covered by the one lens.

(8)
The light-emitting unit according to (7), further including a reflecting section that is provided in the package, and separates the two or more light-emitting devices.

(9)
The light-emitting unit according to (8), further including a sealing resin that is filled in the package,
in which a height of the reflecting section is greater than a thickness of the sealing resin.

(10)
The light-emitting unit according to any one of (1) to (9), in which the light-emitting device includes an LED (Light-Emitting Diode).

(11)
A light-emitting unit including:
a substrate;
a plurality of light-emitting devices provided on the substrate;
a lens covering each of the light-emitting devices, and disposed to have a gap between the lens and the substrate; and
a reflecting sheet provided on the substrate, having an opening for each of the lenses, and having one end in a predetermined direction,
the reflecting sheet being provided with a plurality of fitting sections, a circumferential edge on side of the one end of the opening of the reflecting sheet including disposed in the gap.

(12)
The light-emitting unit according to (11), in which the reflecting sheet is further provided with a hole for alignment relative to the substrate.

(13)
The light-emitting unit according to (11) to (12), in which the circumferential edge on the side of the one end of the opening is straight.

(14)
The light-emitting unit according to any one of (11) to (13), in which circumferential edges on the side of one end of all the openings are disposed in the gaps.

(15)
The light-emitting unit according to any one of (11) to (14), in which the lens is further provided with a projected section at a position opposed to the fitting section of the reflecting sheet, the projected section being a projected circumferential edge of the lens.

(16)
The light-emitting unit according to (15), in which the projected section is further provided with a sloped portion that causes a size of the gap to become greater toward outside.

(17)

A display provided with a liquid crystal panel and a light-emitting unit on the backside of the liquid crystal panel, the light-emitting unit including:
a plurality of lenses; and
two or more light-emitting devices covered by each of the lenses,
the two or more light-emitting devices covered by one lens of the lenses being electrically separated from each other.

(18)

A display provided with a liquid crystal panel and a light-emitting unit on the backside of the liquid crystal panel, the light-emitting unit including:
a substrate;
a plurality of light-emitting devices provided on the substrate;
a lens covering each of the light-emitting devices, and disposed to have a gap between the lens and the substrate; and
a reflecting sheet provided on the substrate, having an opening for each of the lenses, and having one end in a predetermined direction,
the reflecting sheet being provided with a plurality of fitting sections, a circumferential edge on side of the one end of the opening of the reflecting sheet including disposed in the gap.

(19)

A lighting apparatus provided with a light-emitting unit, the light-emitting unit including:
a plurality of lenses; and
two or more light-emitting devices covered by each of the lenses,
the two or more light-emitting devices covered by one lens of the lenses being electrically separated from each other.

(20)

A lighting apparatus provided with a light-emitting unit, the light-emitting unit including:
a substrate;
a plurality of light-emitting devices provided on the substrate;
a lens covering each of the light-emitting devices, and disposed to have a gap between the lens and the substrate; and
a reflecting sheet provided on the substrate, having an opening for each of the lenses, and having one end in a predetermined direction,
the reflecting sheet being provided with a plurality of fitting sections, a circumferential edge on side of the one end of the opening of the reflecting sheet including disposed in the gap.

This application claims the benefit of Japanese Priority Patent Application JP2017-136822 filed with the Japan Patent Office on Jul. 13, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light-emitting unit comprising:
a plurality of lenses; and
two or more light-emitting devices covered by each of the lenses,
the two or more light-emitting devices covered by one lens of the lenses being electrically separated from each other,
wherein wavelength bands of light emitted from the two or more light-emitting devices covered by the one lens are the same as each other,
wherein the two or more light-emitting devices covered by the one lens are allowed to pass effective currents therethrough, the effective currents being different in magnitude from each other, and
wherein each of the lenses comprises a plurality of projected sections for securing a reflecting sheet, each of the plurality of projected sections being projected from a circumferential edge of the lens.

2. The light-emitting unit according to claim 1, wherein the two or more light-emitting devices covered by the one lens are disposed side by side in a first direction, and the light-emitting devices disposed adjacently in the lenses adjacent in the first direction are electrically coupled to each other.

3. The light-emitting unit according to claim 2, wherein the light-emitting devices disposed adjacently in the lenses adjacent in a second direction are electrically coupled to each other, the second direction intersecting with the first direction.

4. The light-emitting unit according to claim 1, wherein four of the light-emitting devices are covered by each of the lenses, the four of the light-emitting devices covered by one lens of the lenses being electrically separated from each other, wavelength bands of light emitted from the four light-emitting devices covered by the one lens are the same as each other, and the four light-emitting devices covered by the one lens are allowed to pass effective currents therethrough, the effective currents being different in magnitude from each other.

5. The light-emitting unit according to claim 1, further comprising a package housing the two or more light-emitting devices covered by the one lens.

6. The light-emitting unit according to claim 5, further comprising the reflecting section that is provided in the package, and separates the two or more light-emitting devices.

7. The light-emitting unit according to claim 6, further comprising a sealing resin that is filled in the package,
wherein a height of the reflecting section is greater than a thickness of the sealing resin.

8. The light-emitting unit according to claim 1, wherein the light-emitting device comprises an LED (Light-Emitting Diode).

9. A light-emitting unit comprising:
a substrate;
a plurality of light-emitting devices provided on the substrate;
a lens covering each one of groups of two or more of the light-emitting devices, and disposed to have a gap between the lens and the substrate; and
a reflecting sheet provided on the substrate, having an opening for each of the lenses, and having one end in a predetermined direction,
the reflecting sheet being provided with a plurality of fitting sections, each of the fitting sections being disposed in the gap, each of the fitting sections comprising a circumferential edge on a side of the one end of the opening,
wherein for each group wavelength bands of light emitted from the two or more light-emitting devices covered by the lens are the same as each other, wherein for each group the two or more light-emitting devices covered by the lens are allowed to pass effective currents therethrough, the effective currents being different in magnitude from each other, and wherein each of the lenses comprises a plurality of projected sections for securing the reflecting sheet, each of the plurality of projected sections being projected from a circumferential edge of the lens.

10. The light-emitting unit according to claim 9, wherein the reflecting sheet is further provided with a hole for alignment relative to the substrate.

11. The light-emitting unit according to claim 9, wherein the circumferential edge on the side of the one end of the opening comprises a straight portion.

12. The light-emitting unit according to claim 9, wherein circumferential edges on the side of one end of all the openings are disposed in the gaps.

13. The light-emitting unit according to claim 9, wherein for each lens the projected sections comprise at least one projected section at a position opposed to the fitting section of the reflecting sheet.

14. The light-emitting unit according to claim 13, wherein the at least one projected section is further provided with a sloped portion that causes a size of the gap to become greater toward outside.

15. A display provided with a liquid crystal panel and a light-emitting unit on a backside of the liquid crystal panel, the light-emitting unit comprising:
a plurality of lenses; and
two or more light-emitting devices covered by each of the lenses,
the two or more light-emitting devices covered by one lens of the lenses being electrically separated from each other,
wherein wavelength bands of light emitted from the two or more light-emitting devices covered by the one lens are the same as each other,
wherein the two or more light-emitting devices covered by the one lens are allowed to pass effective currents therethrough, the effective currents being different in magnitude from each other and
wherein each of the lenses comprises a plurality of projected sections for securing a reflecting sheet, each of the plurality of projected sections being projected from a circumferential edge of the lens.

16. A display provided with a liquid crystal panel and a light-emitting unit on a backside of the liquid crystal panel, the light-emitting unit comprising:
a substrate;
a plurality of light-emitting devices provided on the substrate;
a lens covering each one of groups of two or more of the light-emitting devices, and disposed to have a gap between the lens and the substrate; and
a reflecting sheet provided on the substrate, having an opening for each of the lenses, and having one end in a predetermined direction,
the reflecting sheet being provided with a plurality of fitting sections, each of the fitting sections being disposed in the gap, each of the fitting sections comprising a circumferential edge on a side of the one end of the opening,
wherein for each group wavelength bands of light emitted from the two or more light-emitting devices covered by the lens are the same as each other,
wherein for each group the two or more light-emitting devices covered by the lens are allowed to pass effective currents therethrough, the effective currents being different in magnitude from each other, and
wherein each of the lenses comprises a plurality of projected sections for securing the reflecting sheet, each of the plurality of projected sections being projected from a circumferential edge of the lens.

17. A lighting apparatus provided with a light-emitting unit, the light-emitting unit comprising:
a plurality of lenses; and
two or more light-emitting devices covered by each of the lenses,
the two or more light-emitting devices covered by one lens of the lenses being electrically separated from each other,
wherein wavelength bands of light emitted from the two or more light-emitting devices covered by the one lens are the same as each other,
wherein the two or more light-emitting devices covered by the one lens are allowed to pass effective currents therethrough, the effective currents being different in magnitude from each other, and
wherein each of the lenses comprises a plurality of projected sections for securing a reflecting sheet, each of the plurality of projected sections being projected from a circumferential edge of the lens.

18. A lighting apparatus provided with a light-emitting unit, the light-emitting unit comprising:
a substrate;
a plurality of light-emitting devices provided on the substrate;
a lens covering each one of groups of two or more of the light-emitting devices, and disposed to have a gap between the lens and the substrate; and
a reflecting sheet provided on the substrate, having an opening for each of the lenses, and having one end in a predetermined direction,
the reflecting sheet being provided with a plurality of fitting sections, each of the fitting sections being disposed in the gap, each of the fitting sections comprising a circumferential edge on a side of the one end of the opening,
wherein for each group wavelength bands of light emitted from the two or more light-emitting devices covered by the lens are the same as each other,
wherein for each group the two or more light-emitting devices covered by the lens are allowed to pass effective currents therethrough, the effective currents being different in magnitude from each other, and
wherein each of the lenses comprises a plurality of projected sections for securing the reflecting sheet, each of the plurality of projected sections being projected from a circumferential edge of the lens.

19. The light-emitting unit according to claim 1, further comprising:
a package filled with a sealing resin that houses the two or more light-emitting devices; and
a reflecting section in the package that separates the two or more light-emitting devices and has a height greater than a height of the sealing resin.

* * * * *